(12) United States Patent
Bae et al.

(10) Patent No.: US 11,211,534 B2
(45) Date of Patent: Dec. 28, 2021

(54) DISPLAY DEVICE AND METHOD OF FABRICATING THE SAME

(71) Applicant: Samsung Display Co., Ltd., Yongin-si (KR)

(72) Inventors: Subin Bae, Hwaseong-si (KR); Sungwon Cho, Hwaseong-si (KR); Yu-gwang Jeong, Anyang-si (KR); Sanggab Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 47 days.

(21) Appl. No.: 16/698,834

(22) Filed: Nov. 27, 2019

(65) Prior Publication Data

US 2020/0176656 A1 Jun. 4, 2020

(30) Foreign Application Priority Data

Dec. 4, 2018 (KR) .................. 10-2018-0154438

(51) Int. Cl.
*H01L 33/62* (2010.01)
*H01L 33/40* (2010.01)
(Continued)

(52) U.S. Cl.
CPC .......... *H01L 33/62* (2013.01); *H01L 25/0753* (2013.01); *H01L 33/0095* (2013.01);
(Continued)

(58) Field of Classification Search
CPC . H01L 33/62; H01L 25/0753; H01L 33/0095; H01L 33/405
See application file for complete search history.

(56) References Cited

U.S. PATENT DOCUMENTS 7,466,026 B2 12/2008 Song et al.
8,928,018 B2 1/2015 Ikeda et al.
(Continued)

FOREIGN PATENT DOCUMENTS

KR 10-1085443 11/2011
KR 10-2012-0092508 8/2012
(Continued)

*Primary Examiner* — Michael Jung
(74) *Attorney, Agent, or Firm* — Kile Park Reed & Houtteman PLLC

(57) ABSTRACT

A display device includes: a pixel circuit disposed on a base layer; an insulating layer disposed on the base layer covering the pixel circuit; a first electrode disposed on the insulating layer; a second electrode disposed on the insulating layer, the second electrode being spaced apart from the first electrode in a first direction; a light-emitting element disposed between the first electrode and the second electrode; a connection electrode connecting the first electrode and the light-emitting element and connecting the second electrode and the light-emitting element; a first auxiliary insulating layer disposed on the light-emitting element; and a second auxiliary insulating layer disposed on the first auxiliary insulating layer. The second auxiliary insulating layer includes a first insulating portion overlapped with the first auxiliary insulating layer, and a second insulating portion disposed outwardly from the first insulating portion and not overlapping the first auxiliary insulating layer.

23 Claims, 18 Drawing Sheets

(51) Int. Cl.
    *H01L 33/00*         (2010.01)
    *H01L 25/075*       (2006.01)

(52) U.S. Cl.
    CPC .... *H01L 33/405* (2013.01); *H01L 2933/0016* (2013.01); *H01L 2933/0066* (2013.01)

(56) References Cited

U.S. PATENT DOCUMENTS

| | | | |
|---|---|---|---|
| 2013/0001579 A1* | 1/2013 | Jung | H01L 27/088 257/72 |
| 2018/0019369 A1 | 1/2018 | Cho et al. | |
| 2018/0026074 A1 | 1/2018 | Lee et al. | |
| 2018/0151647 A1* | 5/2018 | Lee | H01L 27/3246 |
| 2018/0175009 A1 | 6/2018 | Kim et al. | |
| 2018/0175106 A1* | 6/2018 | Kim | H01L 33/20 |
| 2019/0181301 A1* | 6/2019 | Kim | H01L 25/0753 |
| 2019/0252634 A1* | 8/2019 | Kim | H01L 51/5237 |

FOREIGN PATENT DOCUMENTS

| | | |
|---|---|---|
| KR | 10-2018-0007376 | 1/2018 |
| KR | 10-2018-0011404 | 2/2018 |

\* cited by examiner

DISPLAY DEVICE AND METHOD OF FABRICATING THE SAME

CROSS-REFERENCE TO RELATED APPLICATION

This application claims priority from and the benefit of Korean Patent Application No. 10-2018-0154438, filed on Dec. 4, 2018, which is hereby incorporated by reference for all purposes as if fully set forth herein.

BACKGROUND

Field

Exemplary implementations of the invention relate generally to a display device and, more specifically, to a display device having a light-emitting element and a method of fabricating the same.

Discussion of the Background

A light emitting diode (hereinafter, a light-emitting element) possesses various technical advantages, such as good durability in severe environments, a sufficiently long life span, and a good brightness property. Recently, many studies are actively being conducted to apply the light-emitting element to various light emitting devices.

For example, a structure, which is obtained by growing an inorganic crystal structure (e.g., a nitride-based semiconductor material), is used to fabricate a very small (e.g., micro- or nano-scaled) rod-shaped light-emitting element. As an example, the rod-shaped light-emitting element can be fabricated to be enough small to be used as a pixel of a self-luminescent display panel.

Fabricating large numbers of such micro- or nano-scaled light-emitting elements required for modern display device in a cost effective manner produces numerous technical challenges.

The above information disclosed in this Background section is only for understanding of the background of the inventive concepts, and, therefore, it may contain information that does not constitute prior art.

SUMMARY

Display devices including a plurality of very small light-emitting elements constructed according to the principles and exemplary implementations of the invention and methods of fabricating the same according to the principles and exemplary implementations of the invention provide improved reliability and reduced fabrication time and/or cost. For example, according to the principles and exemplary embodiments of the invention, portions of a connection electrode connecting a light-emitting element to first and second electrodes may be simultaneously formed through the same deposition process.

Additional features of the inventive concepts will be set forth in the description which follows, and in part will be apparent from the description, or may be learned by practice of the inventive concepts.

A display device constructed according to one or more embodiments includes: a base layer; a pixel circuit disposed on the base layer; an insulating layer disposed on the base layer covering the pixel circuit; a first electrode electrically connected to the pixel circuit and disposed on the insulating layer; a second electrode electrically connected to the pixel circuit and disposed on the insulating layer, the second electrode being spaced apart from the first electrode in a first direction; a light-emitting element disposed between the first electrode and the second electrode and electrically connected to the first electrode and the second electrode; a connection electrode connecting the first electrode and the light-emitting element and connecting the second electrode and the light-emitting element; a first auxiliary insulating layer disposed on the light-emitting element; and a second auxiliary insulating layer disposed on the first auxiliary insulating layer, the first auxiliary insulating layer being disposed between the second auxiliary insulating layer and the light-emitting element, wherein the second auxiliary insulating layer includes a first insulating portion overlapped with the first auxiliary insulating layer, and a second insulating portion disposed outwardly from the first insulating portion and not overlapping the first auxiliary insulating layer.

A width of the first auxiliary insulating layer may be smaller than a width of the second auxiliary insulating layer.

The width of the second auxiliary insulating layer may be smaller than a width of the light-emitting element, the first auxiliary insulating layer may be entirely overlapped by the second auxiliary insulating layer, and the second auxiliary insulating layer may be entirely overlapped by the light-emitting element.

The first auxiliary insulating layer may include SiOx, and the second auxiliary insulating layer may include SiNx.

When measured in a thickness direction of the base layer, a distance separating the first insulating portion from the light-emitting element may be substantially equal to a distance separating the second insulating portion and the light-emitting element.

The connection electrode may include: a dummy connection electrode disposed on the second auxiliary insulating layer; a first connection electrode connecting the first electrode and the light-emitting element; and a second connection electrode connecting the second electrode and the light-emitting element, the first and second connection electrodes being spaced apart from each other, wherein the dummy connection electrode may be spaced apart from the first connection electrode and the second connection electrode.

The first connection electrode and the second connection electrode may be spaced apart from each other with the first auxiliary insulating layer being interposed therebetween, and the dummy connection electrode, the first connection electrode, and the second connection electrode may include the same conductive material.

When measured in a thickness direction of the base layer, a distance separating the second auxiliary insulating layer and the first connection electrode disposed on the light-emitting element may be substantially equal to a distance separating the second auxiliary insulating layer and the second connection electrode disposed on the light-emitting element.

The dummy connection electrode may cover at least three intersecting surfaces of the second auxiliary insulating layer.

The connection electrode may overlap the light-emitting element.

The display device may further include: a first partition wall disposed between the first electrode and the insulating layer; and a second partition wall disposed between the second electrode and the insulating layer, wherein the light-emitting element may be disposed between the first partition wall and the second partition wall.

The first electrode may include a first reflective electrode, which is electrically connected to the pixel circuit and includes a reflective material, and a first capping electrode, which covers the first reflective electrode, and the second electrode may include a second reflective electrode, which receives a power voltage and includes a reflective material, and a second capping electrode, which covers the second reflective electrode.

The display device may further include a third auxiliary insulating layer disposed on the light-emitting element and the insulating layer, wherein a portion of the third auxiliary insulating layer may be recessed in a thickness direction of the base layer.

A display device constructed according to another embodiment includes: a base layer; a pixel circuit disposed on the base layer; an insulating layer disposed on the base layer to cover the pixel circuit; a first electrode electrically connected to the pixel circuit and disposed on the insulating layer; a second electrode electrically connected to the pixel circuit and disposed on the insulating layer, the second electrode being spaced apart from the first electrode in a first direction; a light-emitting element disposed between the first electrode and the second electrode and electrically connected to the first electrode and the second electrode; a first auxiliary insulating layer disposed on the light-emitting element; a second auxiliary insulating layer disposed on the first auxiliary insulating layer, the first auxiliary insulating layer being disposed between the second auxiliary insulating layer and the light-emitting element; and a connection electrode including a dummy connection electrode disposed on the second auxiliary insulating layer, a first connection electrode connecting the first electrode and the light-emitting element, and a second connection electrode connecting the second electrode and the light-emitting element, the second connection electrode being spaced apart from the first connection electrode.

The dummy connection electrode may be spaced apart from the first connection electrode and the second connection electrode and is substantially disposed over the second auxiliary insulating layer, and wherein the dummy connection electrode, the first connection electrode, and the second connection electrode may include the same conductive material.

A width of the first auxiliary insulating layer may be smaller than a width of the second auxiliary insulating layer, and the width of the second auxiliary insulating layer may be smaller than a width of the light-emitting element.

A method of fabricating a display device according to one or more exemplary embodiments includes steps of: forming a pixel circuit on a base layer; forming an insulating layer on the base layer to cover the pixel circuit; forming a first electrode and a second electrode spaced apart from each other, and a light-emitting element disposed between the first electrode and the second electrode, on the insulating layer; forming a first auxiliary layer on the insulating layer covering the light-emitting element; forming a second auxiliary layer on the first auxiliary layer; forming a photoresist pattern on the second auxiliary layer overlapped with the light-emitting element; removing a portion of the second auxiliary layer, which is exposed from the photoresist pattern, using a first gas to form a second auxiliary insulating layer; removing a portion of the first auxiliary layer, which is exposed from the second auxiliary insulating layer, using a second gas to form a first auxiliary insulating layer; and depositing a conductive material to simultaneously form a first connection electrode connecting the first electrode and the light-emitting element, a second connection electrode connecting the second electrode and the light-emitting element, and a dummy connection electrode disposed on the second auxiliary insulating layer.

An etch rate of the first auxiliary insulating layer may be higher than an etch rate of the second auxiliary insulating layer.

The first connection electrode and the second connection electrode may be spaced apart from the dummy connection electrode by the first auxiliary insulating layer.

The method may further include the step of forming a first partition wall and a second partition wall, which are spaced apart from each other with the light-emitting element interposed therebetween.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

Figure 1:
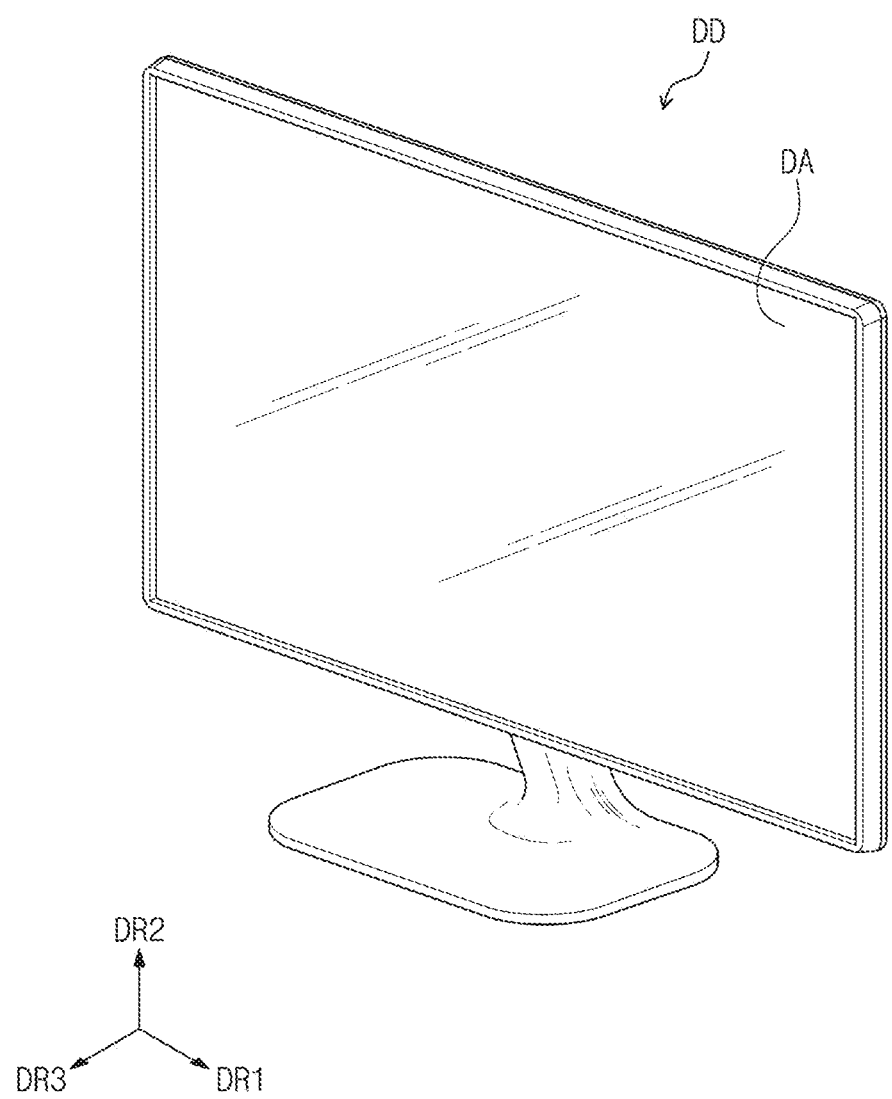
FIG. 1 is a perspective view of an exemplary embodiment of a display device constructed according to the principles of the invention.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
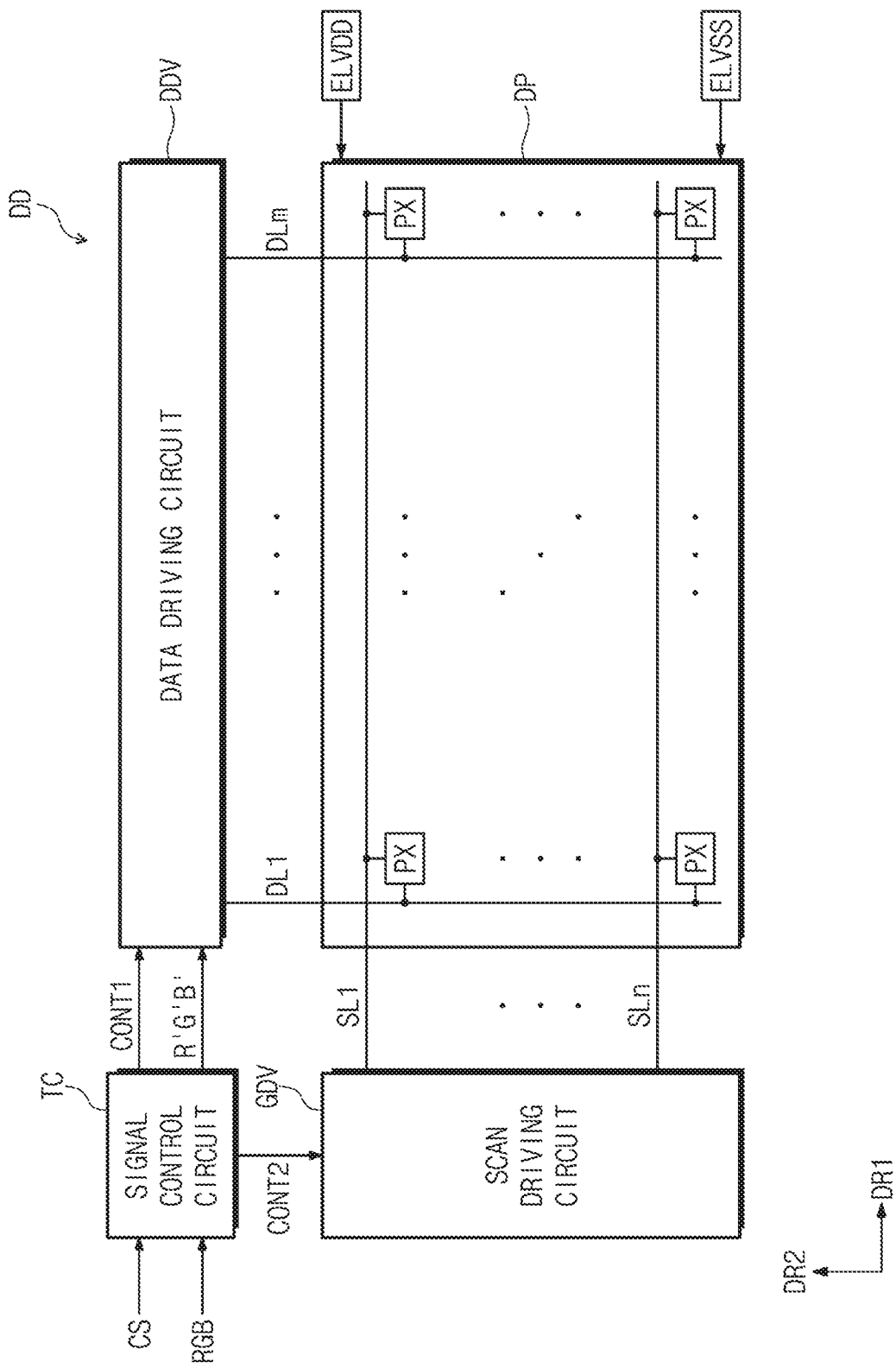
FIG. 2A is a block diagram of an exemplary embodiment of a display device constructed according to the principles of the invention.
Figure 2B:
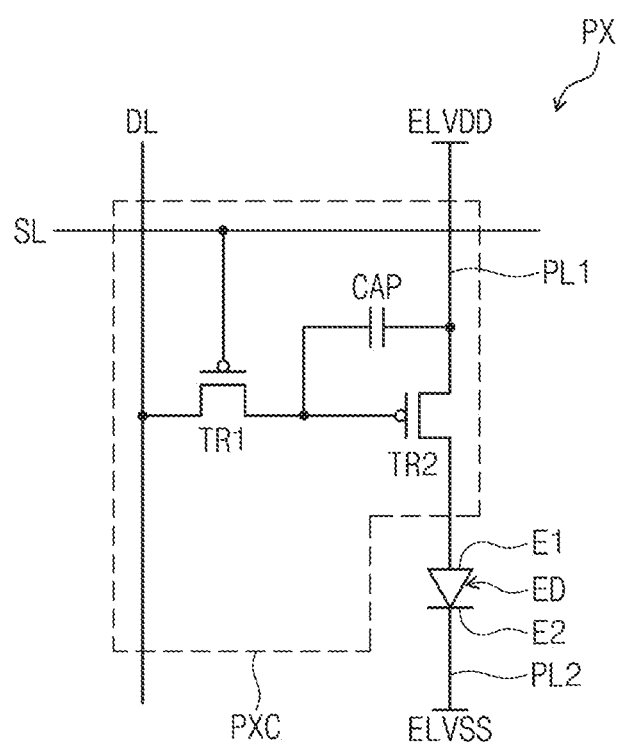
FIG. 2B is an equivalent circuit diagram of an exemplary embodiment of a representative pixel of the display device of FIG. 2A.

FIG. 1 is a perspective view of an exemplary embodiment of a display device constructed according to the principles of the invention. FIG. 2A is a block diagram of an exemplary embodiment of a display device constructed according to the principles of the invention. FIG. 2B is an equivalent circuit diagram of an exemplary embodiment of a representative pixel of the display device of FIG. 2A.

Referring to FIG. 1, a display device DD may display an image through a display region DA. FIG. 1 illustrates an example, in which the display region DA is disposed to be substantially parallel to a first direction DR1 and a second direction DR2 intersecting the first direction DR1. However, in an exemplary embodiment, the display region of the display device may be provided on a curved surface. In an exemplary embodiment, the display device DD may further include a non-display region adjacent to the display region DA, and the non-display region may not be used to display an image. The non-display region may be disposed adjacent to a region of the display region DA or may enclose the display region DA.

The thickness direction of the display device DD will be referred to as a third direction DR3. Directions indicated by the first to third directions DR1, DR2, and DR3 may be relative concepts, and in an exemplary embodiment, they may be changed to indicate other directions. In the specification, the expression "when viewed in a plan view" or "in a plan view" may be used to describe a shape of an object viewed in the third direction DR3. The thickness direction may be the third direction DR3.

FIG. 1 illustrates an example in which the display device DD is a television set. However, the display device DD may be used for large-sized electronic devices (e.g., monitors, and outdoor billboards) or small- or medium-sized electronic devices (e.g., personal computers, notebook computers, personal digital assistants, car navigation systems, game machines, smart phones, tablets, and cameras). However, it should be understood that these are merely examples, and that other electronic devices may be used to realize exemplary embodiments, consistent with the inventive concepts.

Referring to FIG. 2A, the display device DD may include a display panel DP, a signal control circuit TC, a data driving circuit DDV, and a scan driving circuit GDV. Each of the signal control circuit TC, the data driving circuit DDV and the scan driving circuit GDV may include a plurality of circuits.

According to an exemplary embodiment, the display panel DP may be a micro light-emitting element display panel including micro light-emitting elements. For example, the display panel DP may be a micro LED display panel. The structure of the display panel DP including the micro light-emitting element will be described in more detail with reference to FIGS. 4A, 4B, and 5.

The display panel DP may include a plurality of data lines DL1-DLm, a plurality of scan lines SL1-SLn, and a plurality of pixels PX.

The data lines DL1-DLm may extend in the second direction DR2 and may be arranged in the first direction DR1 intersecting the second direction DR2. The scan lines SL1-SLn may extend in the first direction DR1 and may be arranged in the second direction DR2.

Each of the pixels PX may include a micro light-emitting element, which will be referred to as a light-emitting element, and a pixel circuit, which is electrically connected to the light-emitting element. The pixel circuit may include a plurality of transistors. A first power voltage ELVDD and a second power voltage ELVSS may be provided to each of the pixels PX.

The pixels PX may be arranged on a surface of the display panel DP, in a regular manner or with a specific arrangement rule. Each of the pixels PX may display one of primary colors or one of mixed colors. The primary colors may include red, green, and blue, and the mixed colors may include various colors, such as yellow, cyan, magenta, and white. However, colors, which can be displayed by the pixels PX, are not limited to the above colors.

In detail, each or at least one of the pixels PX may have the equivalent circuit diagram of FIG. 2B. The pixel PX may be connected to a plurality of signal lines. Some (e.g., a scan line SL, a data line DL, a first power line PL1, and a second power line PL2) of the signal lines are exemplarily illustrated in FIG. 2B. However, exemplary embodiments of the pixel PX are not limited to this example, and the pixel PX may be further connected to various other signal lines.

The pixel PX may include a light-emitting element ED, a first electrode E1, a second electrode E2, and a pixel circuit PXC. The pixel circuit PXC may include a first thin film transistor TR1, a capacitor CAP, and a second thin film transistor TR2. However, this is just an example, and the numbers of the thin film transistor and the capacitor constituting the pixel circuit PXC are not limited to those shown in FIG. 2B. For example, in another exemplary embodiment, the pixel circuit PXC may include a plurality of thin film transistors and a plurality of capacitors.

The first thin film transistor TR1 may be a switching transistor configured to control the on/off operation of the pixel PX. The first thin film transistor TR1 may transmit or block a data signal transmitted through the data line DL, in response to a scan signal transmitted through the scan line SL.

The capacitor CAP may be connected to the first thin film transistor TR1 and the first power line PL1. The capacitor CAP may be used to store electric charges, and an amount of the electric charges stored in the capacitor CAP may be determined by a voltage difference between the data signal transmitted through the first thin film transistor TR1 and the first power voltage ELVDD applied to the first power line PL1.

The second thin film transistor TR2 may be connected to the first thin film transistor TR1, the capacitor CAP, and the light-emitting element ED. The second thin film transistor TR2 may control a driving current flowing through the light-emitting element ED in accordance with an amount of charges stored in the capacitor CAP. A turn-on time of the second thin film transistor TR2 may be determined depending on the amount of charges stored in the capacitor CAP.

In an exemplary embodiment, the first thin film transistor TR1 and the second thin film transistor TR2 may be p-type transistors, but exemplary embodiments of the pixel PX are not limited to this example. In another exemplary embodiment, the first thin film transistor TR1 and the second thin film transistor TR2 may be n-type transistors or p-type transistors. In other exemplary embodiment, at least one of the first thin film transistor TR1 and the second thin film transistor TR2 may be an n-type thin film transistor, and the other may be a p-type thin film transistor.

The light-emitting element ED may be connected to the second thin film transistor TR2 and the second power line PL2. For example, the light-emitting element ED may be connected to the first electrode E1, which is electrically connected to the second thin film transistor TR2, and to the second electrode E2, which is connected to the second power line PL2. The first electrode E1 may be electrically connected to the pixel circuit PXC, and the second electrode E2 may receive the second power voltage ELVSS through the second power line PL2.

The light-emitting element ED may emit light, and here, an intensity of the emitted light may be determined by a voltage difference between a power signal, which is transferred through the second thin film transistor TR2, and the second power voltage ELVSS, which is received through the second power line PL2.

According to an exemplary embodiment, the light-emitting element ED may be a micro-LED device. The micro-LED device may be an LED element whose length ranges from several nanometers to several hundred micrometers. However, the length of the micro-LED device is not limited to the above example or a specific range.

An example, in which the light-emitting element ED is solely connected between the second thin film transistor TR2 and the second power line PL2, is illustrated in FIG. 2B, but, in an exemplary embodiment, a plurality of the light-emitting elements ED may be provided. The plurality of the light-emitting elements ED may be connected in parallel to each other.

Referring back to FIG. 2A, the signal control circuit TC may receive image data RGB provided from the outside. The signal control circuit TC may convert the image data RGB to image data R'G'B', which are suitable for operations of the display panel DP, and then may output the converted image data R'G'B' to the data driving circuit DDV.

The signal control circuit TC may receive a control signal CS provided from the outside. The control signal CS may include a vertical synchronization signal, a horizontal synchronization signal, a main clock signal, and a data enable signal, or the like. The signal control circuit TC may provide a first control signal CONT1 to the data driving circuit DDV and may provide a second control signal CONT2 to the scan driving circuit GDV. The first control signal CONT1 may be a signal for controlling the data driving circuit DDV, and the second control signal CONT2 may be a signal for controlling the scan driving circuit GDV.

The data driving circuit DDV may drive the data lines DL1-DLm, in response to the first control signal CONT1 from the signal control circuit TC. The data driving circuit DDV may be implemented as a separate integrated circuit and may be electrically connected to a side region of the display panel DP. In an exemplary embodiment, the data driving circuit DDV may be directly mounted on the display panel DP. Furthermore, the data driving circuit DDV may be provided in the form of a single chip or may include a plurality of chips.

The scan driving circuit GDV may be integrated on a specific region of the display panel DP. For example, the scan driving circuit GDV may include a plurality of thin-film transistors that are formed by the same process as that for the pixel circuit of the pixel PX (e.g., by a low temperature polycrystalline silicon (LTPS) process or a low temperature polycrystalline oxide (LTPO) process). In an exemplary embodiment, the scan driving circuit GDV may be implemented as a separate integrated circuit chip and may be electrically connected to a portion of the display panel DP.

The scan driving circuit GDV may drive the scan lines SL1-SLn in response to the second control signal CONT2 from the signal control circuit TC. While one of the scan lines SL1-SLn is applied with a gate-on voltage, a switching transistor of each pixel in a row of pixels connected thereto may be turned on. Here, the data driving circuit DDV may provide data driving signals to the data lines DL1-DLm. The data driving signals provided to the data lines DL1-DLm may be respectively applied to corresponding pixels through the turned-on switching transistors. The data driving signals may be analog voltages corresponding to gradation levels of the image data.

Figure 3:
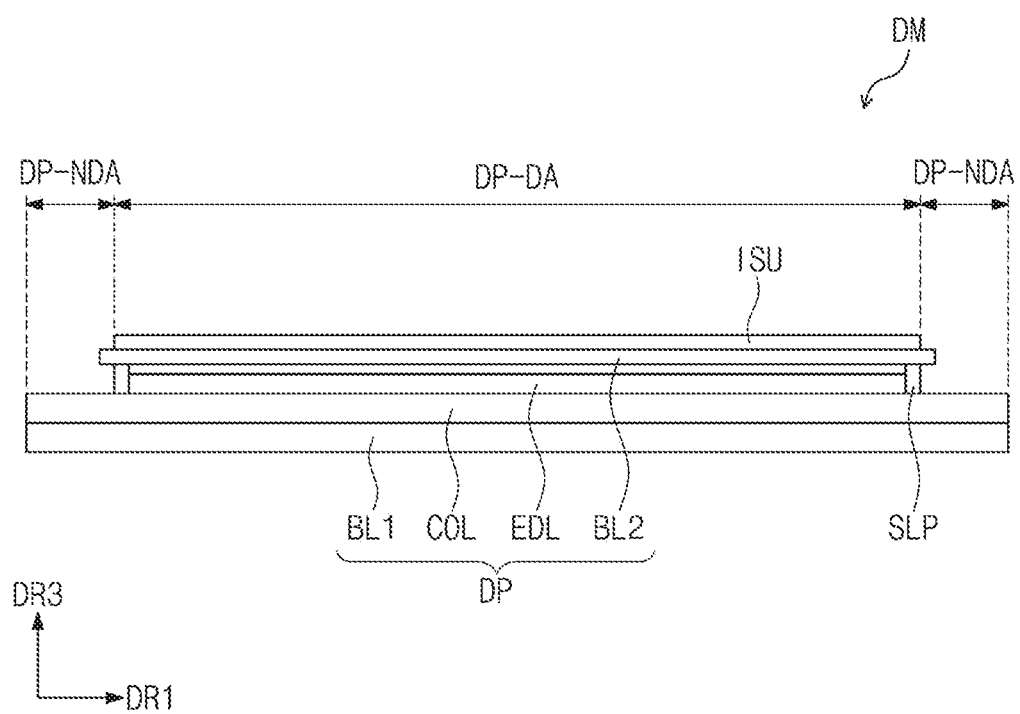
FIG. 3 is a sectional view of an exemplary embodiment of a display device of the display device of FIG. 2A.

FIG. 3 is a sectional view of an exemplary embodiment of a display device of the display device of FIG. 2A. The display device DD shown in FIG. 3 may include the display panel DP and an input sensing unit ISU (or a touch sensing unit) disposed on the display panel DP. The display panel DP and the input sensing unit ISU are shown as being included in a display module DM. In an exemplary embodiment, the input sensing unit ISU may be included in the display module DM or may be omitted.

In detail, referring to FIG. 3, the display panel DP may include a first base layer BL1, a circuit layer COL, a display element layer EDL, and a second base layer BL2. The display panel DP may include a display region DP-DA and a non-display region DP-NDA. The display region DP-DA of the display panel DP may correspond to the display region DA of the display device DD described with reference to FIG. 1. In addition, the non-display region DP-NDA may be adjacent to a side portion of the display region DP-DA or may enclose the display region DP-DA. In an exemplary embodiment, the non-display region DP-NDA may be omitted.

The first base layer BL1 may support elements of the display panel DP and the input sensing unit ISU and may include a flexible material. For example, the first base layer BL1 may include a plastic substrate, a glass substrate, or a substrate made of an organic/inorganic composite material. Alternatively, the first base layer BL1 may have a stacked structure including a plurality of insulating layers. The plastic substrate may include at least one of acrylic resins, methacryl resins, polyisoprene resins, vinyl resins, epoxy resins, urethane resins, cellulose resins, siloxane resins, polyimide resins, polyamide resins, or perylene resins.

The circuit layer COL may include a plurality of insulating layers, a plurality of conductive layers, and a semiconductor layer. The plurality of conductive layers of the circuit layer COL may include the signal lines and/or the pixel circuit of the pixel.

The display element layer EDL may be overlapped with the display region DP-DA and may be disposed on the circuit layer COL. The display element layer EDL may include a light-emitting element (e.g., micro light-emitting elements). However, exemplary embodiments of the display panel DP are not limited thereto, and depending on kind of the display panel DP, the display element layer EDL may include organic light emitting diodes, inorganic light emitting diodes, or organic-inorganic hybrid light emitting diodes.

The second base layer BL2 may seal the display element layer EDL. As an example, the second base layer BL2 may be overlapped with each of the display region DP-DA and the non-display region DP-NDA or may not be overlapped with the non-display region DP-NDA.

In an exemplary embodiment, the second base layer BL2 may be an encapsulation substrate. The second base layer BL2 may protect the display element layer EDL from a contamination material, such as moisture, oxygen, and dust particles. The second base layer BL2 may be coupled to the first base layer BL1 through a sealing member SLP. The sealing member SLP may include a frit. However, exemplary embodiments are not limited to this example, and various materials may be used for the sealing member SLP.

The input sensing unit ISU may be overlapped with the display region DP-DA and may be disposed on the second base layer BL2. The input sensing unit ISU may be directly disposed on the second base layer BL2. In the specification, the expression "an element A is directly disposed on an element B" means that an adhesive layer/member is not disposed between the elements A and B.

The input sensing unit ISU may sense an external input in a capacitive sensing manner. The external input may be provided in various forms. For example, the external input may include various types of external inputs, such as a part (e.g., a hand or a finger) of a user's body, a stylus pen, light, heat, or pressure. The external input may be a non-touching-type event (e.g., a hovering event near the sensing unit SU), in addition to such a touching-type event caused by the user's hand.

exemplary embodiments are not limited to a specific sensing method of the input sensing unit ISU, and in an exemplary embodiment, the input sensing unit ISU may sense an external input in an electromagnetic induction manner or a pressure-sensing manner. In another exemplary embodiment, the input sensing unit ISU may be separately fabricated and then may be attached to the display panel DP by the adhesive layer, or the input sensing unit ISU may be omitted.

In the meantime, FIG. 3 illustrates an example, in which the input sensing unit ISU is directly formed on the second base layer BL2 through a successive process, but exemplary embodiments of the display module DM are not limited to this example. For example, an adhesive member may be provided between the input sensing unit ISU and the second base layer BL2, and in this case, the input sensing unit ISU and the second base layer BL2 may be attached to each other by the adhesive member.

Figure 4A:
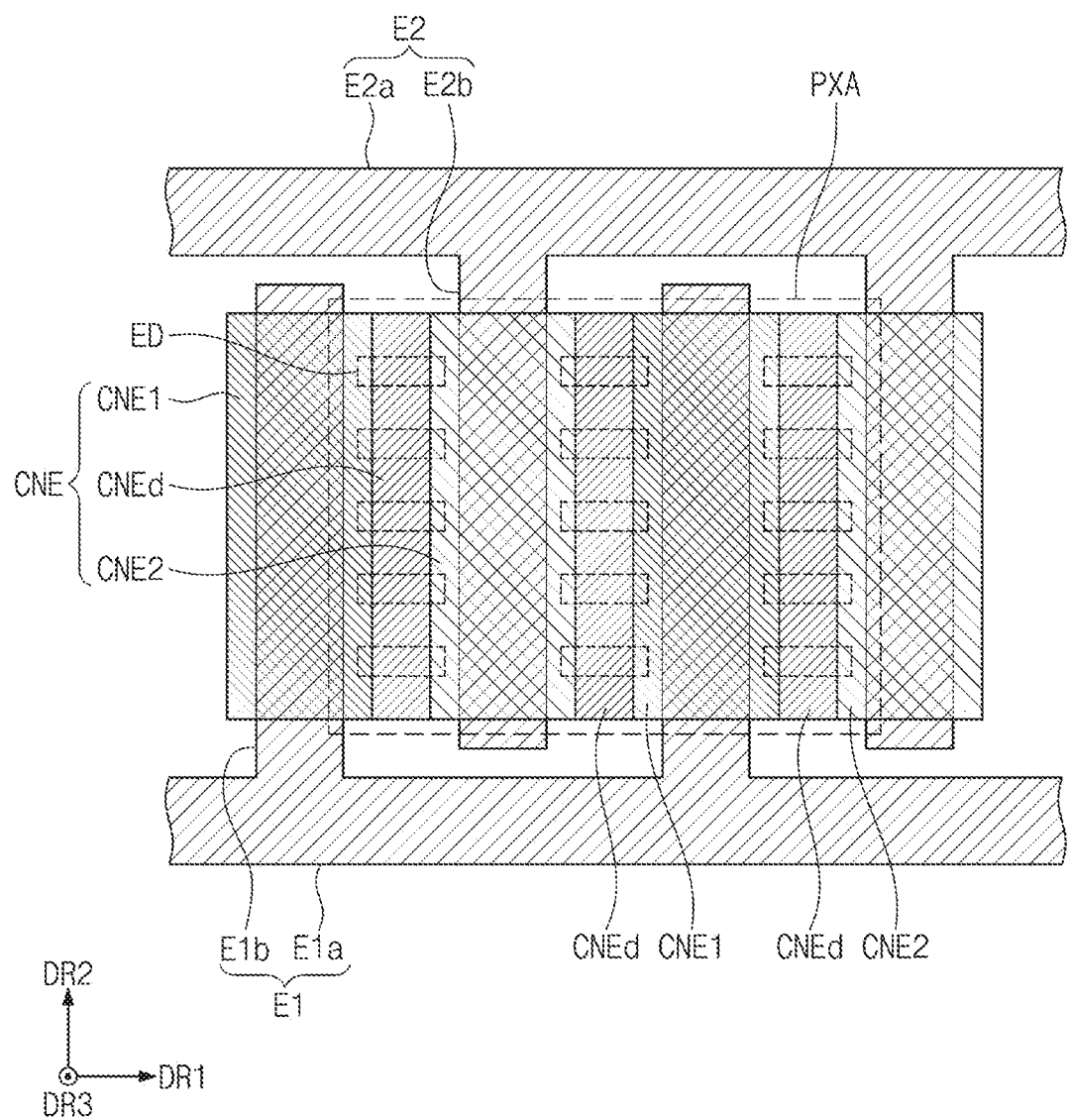
FIG. 4A is a plan view of an exemplary embodiment of electrodes and light-emitting elements of the display panel of FIG. 2A.
Figure 4B:
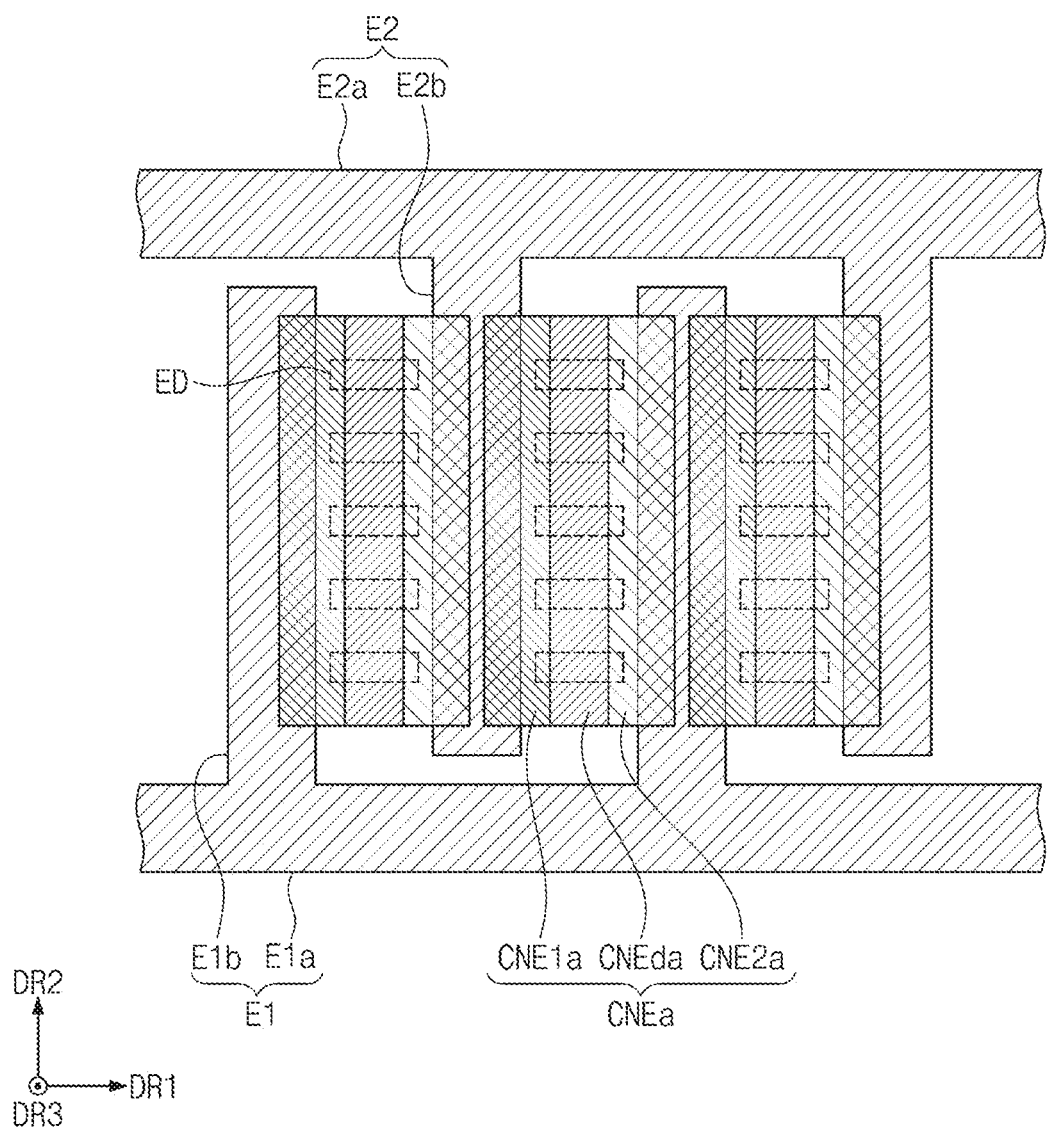
FIG. 4B is a plan view of another exemplary embodiment of electrodes and light-emitting elements of the display panel of FIG. 2A.

FIG. 4A is a plan view of an exemplary embodiment of electrodes and light-emitting elements of the display panel of FIG. 2A. FIG. 4B is a plan view of another exemplary embodiment of electrodes and light-emitting elements of the display panel of FIG. 2A. In order to reduce complexity in the drawings and to provide better understanding of exemplary embodiments, some elements (e.g., the light-emitting element ED, the first electrode E1, and the second electrode E2) of the pixel PX of FIG. 2B are illustrated in FIGS. 4A and 4B, and other elements are omitted from FIGS. 4A and 4B.

Referring to FIG. 4A, each pixel PX may include the light-emitting element ED, the first electrode E1, and the second electrode E2. As shown in FIG. 4A, the display panel may include a plurality of the light-emitting elements ED which are connected in parallel to form the light-emitting element ED of FIG. 2B. FIG. 4A illustrates a plurality of the light-emitting elements ED, which are arranged to form three columns as an example.

The first electrode E1 may include a first sub electrode E1a, which extends in the first direction DR1, and a plurality of first branch electrodes E1b, which project upwardly from the first sub electrode E1a in the second direction DR2. The first branch electrodes E1b may be spaced apart from each other in the first direction DR1.

The second electrode E2 may include a second sub electrode E2a, which extends in the first direction DR1, and a plurality of second branch electrodes E2b, which project downwardly from the second sub electrode E2a in the second direction DR2. The second branch electrodes E2b may be spaced apart from each other in the first direction DR1.

The first sub electrode E1a and the second sub electrode E2a may be spaced apart from each other in the second direction DR2 and may face each other. In addition, between the first sub electrode E1a and the second sub electrode E2a, the first branch electrodes E1b and the second branch electrodes E2b may be alternately arranged in the first direction DR1 and may be spaced apart from each other in the first direction DR1.

When viewed in a plan view, the light-emitting elements ED may be disposed between the first branch electrode E1b and the second branch electrode E2b facing each other in the first direction DR1. The light-emitting elements ED may extend in the first direction DR1 and may be arranged in the second direction DR2. Furthermore, the light-emitting elements ED may be spaced apart from each other in the second direction DR2.

When viewed in a plan view, the light-emitting elements ED may not be overlapped with and do not contact the first electrode E1 and the second electrode E2. In other words, the light-emitting elements ED may not be directly connected to the first electrode E1 and the second electrode E2.

According to an exemplary embodiment, the light-emitting elements ED may be electrically connected to the first electrode E1 and the second electrode E2 via a connection electrode CNE. When viewed in a plan view, the connection electrode CNE may be overlapped with the first branch electrodes E1b, the second branch electrodes E2b, and the light-emitting elements ED. In particular, the light-emitting elements ED in each column may be entirely overlapped with the connection electrode CNE.

In detail, the connection electrode CNE may include a first connection electrode CNE1, a second connection electrode CNE2, and a dummy connection electrode CNEd. The dummy connection electrode CNEd may be disposed between the first connection electrode CNE1 and the second connection electrode CNE2.

In an exemplary embodiment of FIG. 4A, the first connection electrode CNE1 may be electrically connected to a plurality of light-emitting elements, which are disposed in a group of two columns. The second connection electrode CNE2 may be electrically connected to a plurality of light-emitting elements, which are disposed in another group of two columns. For example, the first connection electrode CNE1 may be electrically connected to ends of light-emitting elements in a first column and to ends of light-emitting elements in a second column. The second connection electrode CNE2 may be electrically connected to opposite ends of the light-emitting elements in the second column and to ends of light-emitting elements in a third column.

Each of the light-emitting elements ED may be connected to the first electrode E1 through the first connection electrode CNE1 and may be connected to the second electrode E2 through the second connection electrode CNE2. In an exemplary embodiment, the dummy connection electrode CNEd may be electrically disconnected from the first connection electrode CNE1 and the second connection electrode CNE2. In other words, the dummy connection electrode CNEd may be spaced apart from each of the first connection electrode CNE1 and the second connection electrode CNE2. As a result, the dummy connection electrode CNEd may be electrically disconnected from the first electrode E1 and the second electrode E2.

According to an exemplary embodiment, the connection electrode CNE shown in FIG. 4A may be formed through a single deposition process. For example, the connection electrode CNE including the first connection electrode CNE1, the second connection electrode CNE2, and the dummy connection electrode CNEd may be formed by performing a deposition process once. Since the connection electrode CNE is formed through a single deposition process, it may be possible to reduce time and cost in a process of fabricating the display device DD. A process of forming the connection electrode CNE will be described in more detail in the following description of the fabricating method.

Except for a difference in structure of the connection electrode CNEa, a pixel of FIG. 4B may have substantially the same structure as the pixel of FIG. 4A. Thus, the structure of the connection electrode CNEa will be mainly described with reference to FIG. 4B, and description of other elements will be omitted to avoid redundancy.

Referring to FIG. 4B, a plurality of the connection electrodes CNEa may be provided between the first sub electrode E1a and the second sub electrode E2a, and, in order to reduce complexity in the drawings, only three connection electrodes CNEa are exemplarily illustrated in FIG. 4B. The plurality of the connection electrodes CNEa may be spaced apart from each other in the first direction DR1. Each of the connection electrodes CNEa may include a first connection electrode CNE1a, a second connection electrode CNE2a, and a dummy connection electrode CNEda. When viewed in a plan view, the dummy connection electrode CNEda may be disposed between the first connection electrode CNE1a and the second connection electrode CNE2a.

In an exemplary embodiment of FIG. 4B, a first connection electrode CNE1a, which is one of a plurality of the first connection electrodes CNE1a and is provided on a first region, may be electrically connected to ends of the light-emitting elements ED in a first column, and a second connection electrode CNE2a, which is one of a plurality of the second connection electrodes CNE2a and is provided on the first region, may be electrically connected to opposite ends of the light-emitting elements ED in the first column. Here, the first region may be a region including one of the first connection electrodes CNE1a and one of the second connection electrodes CNE2a, which are connected to the light-emitting elements ED in the first column.

Each of the light-emitting elements ED in the first column may be connected to the second electrode E2 through the first connection electrode CNE1a and may be connected to the first electrode E1 through the second connection electrode CNE2a. The dummy connection electrode CNEda of the connection electrode CNEa may be electrically disconnected from the first electrode E1 and the second electrode E2. In addition, the dummy connection electrode CNEda of the connection electrode CNEa may be electrically disconnected from the first connection electrode CNE1a and the second connection electrode CNE2a.

In addition, a first connection electrode, which is one of the plurality of the first connection electrodes CNE1a and is provided on a second region, may be electrically connected to ends of the light-emitting elements ED in a second column adjacent to the first column, and a second connection electrode, which is one of the plurality of the second connection electrodes CNE2a and is provided on the second region, may be electrically connected to opposite ends of the light-emitting elements ED in the second column. Here, the second region may be a region including another of the first connection electrodes CNE1a and another of the second connection electrodes CNE2a, which are connected to the light-emitting elements ED in the second column.

In this case, each of the light-emitting elements ED in the second column may be connected to the first electrode E1 through the first connection electrode CNE1a and may be connected to the second electrode E2 through the second connection electrode CNE2a.

In addition, a first connection electrode, which is one of the plurality of the first connection electrodes CNE1a and is provided on a third region, may be electrically connected to ends of the light-emitting elements ED in a third column adjacent to the first column, and a second connection electrode, which is one of the plurality of the second connection electrodes CNE2a and is provided on the third region, may be electrically connected to opposite ends of the light-emitting elements ED in the third column. Here, the third region may be a region including other of the first connection electrodes CNE1a and other of the second connection electrodes CNE2a, which are connected to the light-emitting elements ED in the third column. The first region may be disposed between the second and third regions, and the first column of the light-emitting elements ED may be disposed between the second and third columns of the light-emitting elements ED.

In this case, each of the light-emitting elements ED in the third column may be connected to the first electrode E1 through the first connection electrode CNE1a and may be connected to the second electrode E2 through the second connection electrode CNE2a.

FIGS. 4A and 4B illustrate an example structure of each of the first electrode E1, the second electrode E2, the light-emitting element ED, and the connection electrode CNE or CNEa, which are included in each pixel, but exemplary embodiments are not limited to this example. In other words, the structures of the first electrode E1, the second electrode E2, and the light-emitting element ED may be variously changed. For example, FIGS. 4A and 4B illustrate examples, in which two first branch electrodes E1b and two second branch electrodes E2b are provided, but in another exemplary embodiment, the second branch electrode E2b may be solely disposed between a pair of the first branch electrodes E1b. Alternatively, the first branch electrode E1b may be solely disposed between a pair of the second branch electrodes E2b.

Figure 5:
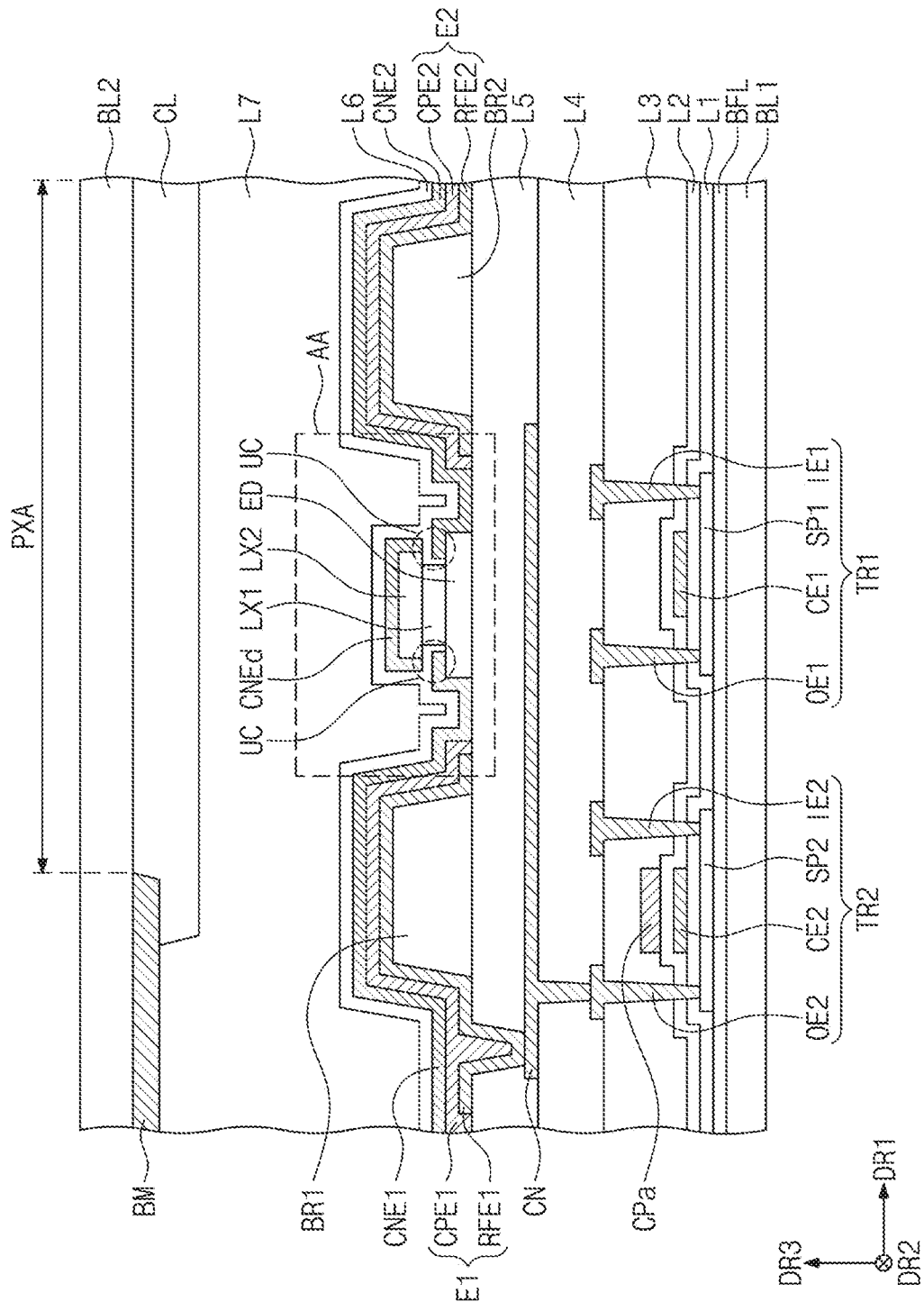
FIG. 5 is a sectional view of a portion of an exemplary embodiment of a display panel of FIG. 2A.
Figure 6:
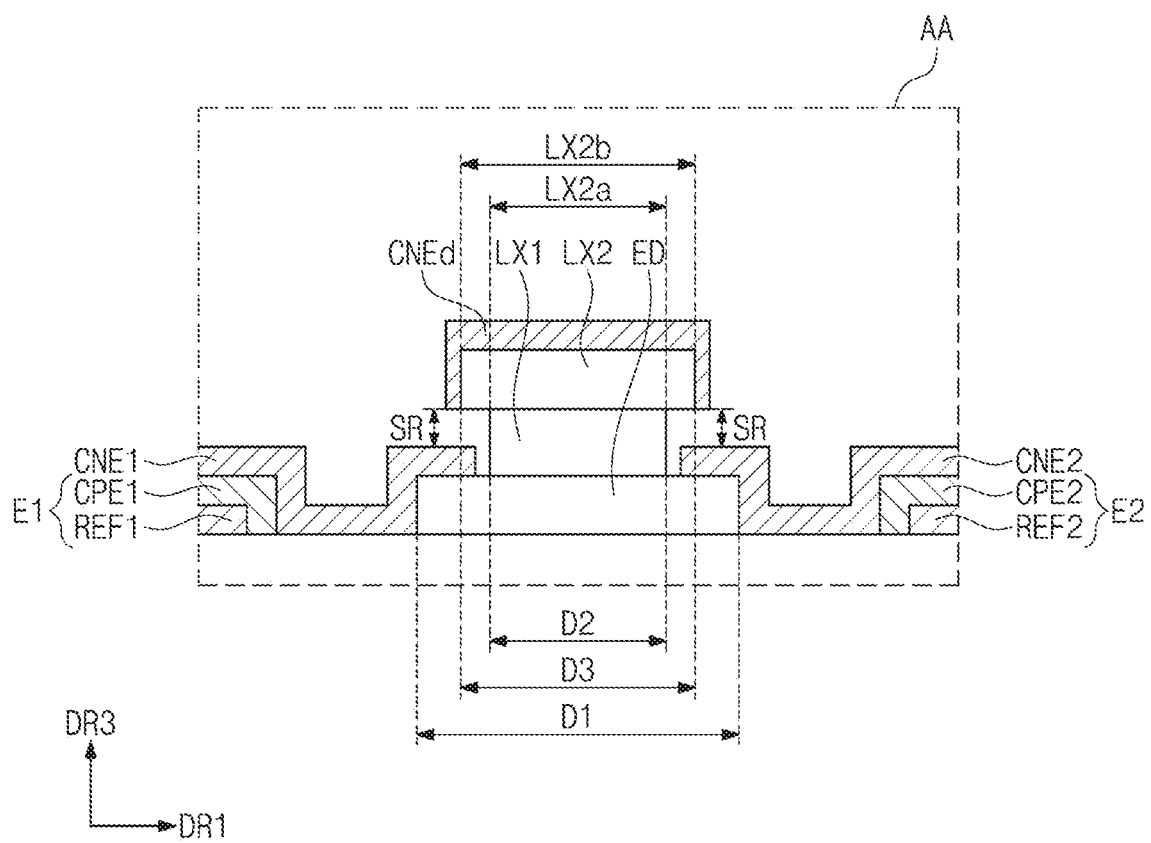
FIG. 6 is an enlarged sectional view of a region 'AA' of FIG. 5.

FIG. 5 is a sectional view of a portion of an exemplary embodiment of a display panel of FIG. 2A. FIG. 6 is an enlarged sectional view of a region 'AA' of FIG. 5.

The first thin film transistor TR1, the second thin film transistor TR2, and a contact electrode CN shown in FIG. 5 may be included in the circuit layer COL of FIG. 3, and the first electrode E1, the second electrode E2, the first connection electrode CNE1, the second connection electrode CNE2, the dummy connection electrode CNEd, and the light-emitting element ED may be included in the display element layer EDL.

Referring to FIG. 5, the first base layer BL1 and the second base layer BL2 may be disposed to face each other. For example, each of the first base layer BL1 and the second base layer BL2 may be a silicon substrate, a plastic substrate, a glass substrate, an insulating film, or a stack including a plurality of insulating layers.

A buffer layer BFL may be disposed on the first base layer BL1. The first thin film transistor TR1 and the second thin film transistor TR2 shown in FIG. 2B may be disposed on the buffer layer BFL.

In detail, the first thin film transistor TR1 may include a first control electrode CE1, a first input electrode IE1, a first output electrode OE1, and a first semiconductor pattern SP1. The second thin film transistor TR2 may include a second control electrode CE2, a second input electrode IE2, a second output electrode OE2, and a second semiconductor pattern SP2.

The first semiconductor pattern SP1 and the second semiconductor pattern SP2 may be disposed on the buffer layer BFL. The buffer layer BFL may provide a modified surface to the first semiconductor pattern SP1 and the second semiconductor pattern SP2. In this case, the first semiconductor pattern SP1 and the second semiconductor pattern SP2 may have an increased adhesion strength to the buffer layer BFL, compared to the case that they are directly formed on the first base layer BL1. In an exemplary embodiment, the buffer layer BFL may be a barrier layer protecting a bottom surface of each of the first semiconductor pattern SP1 and the second semiconductor pattern SP2. In this case, the buffer layer BFL may prevent a contamination material and/or moisture, which are supplied from or through the first base layer BL1, from entering the first semiconductor pattern SP1 and the second semiconductor pattern SP2.

A first insulating layer L1 may be disposed on the buffer layer BFL to cover the first semiconductor pattern SP1 and the second semiconductor pattern SP2. In the specification, the expression "an element A covers an element B" means that the element A is provided to enclose some of the surfaces of the element B. The first insulating layer L1 may include an inorganic material. For example, the inorganic material may be silicon nitride, silicon oxynitride, silicon oxide, titanium oxide, or aluminum oxide, but the inventive concept is not limited to these examples.

The first control electrode CE1 and the second control electrode CE2 may be disposed on the first insulating layer L1. A second insulating layer L2 may be disposed on the first insulating layer L1 to cover the first control electrode CE1 and the second control electrode CE2. The second insulating layer L2 may include an inorganic material.

The capacitor CAP of FIG. 2B may include a first cap electrode and a second cap electrode CPa. For example, the first cap electrode may be a portion, which is divided from the second control electrode CE2, and the second cap electrode CPa may be disposed on the second insulating layer L2.

A third insulating layer L3 may be disposed on the second insulating layer L2 to cover the second cap electrode CPa. The first input electrode IE1, the first output electrode OE1, the second input electrode IE2, and the second output electrode OE2 may be disposed on the third insulating layer L3. The first input electrode IE1 and the first output electrode OE1 may be connected to the first semiconductor pattern SP1 through penetration holes, which are formed to penetrate the first to third insulating layers L1, L2, and L3. The second input electrode IE2 and the second output electrode OE2 may be connected to the second semiconductor pattern SP2 through penetration holes, which are formed to penetrate the first to third insulating layers L1, L2, and L3. Not only the first input electrode IE1, the first output electrode OE1, the second input electrode IE2, and the second output electrode OE2 but also at least a portion of each of the signal lines (e.g., the scan or data lines) may be disposed on the third insulating layer L3.

A fourth insulating layer L4 may be disposed on the third insulating layer L3 to cover the first input electrode IE1, the first output electrode OE1, the second input electrode IE2, and the second output electrode OE2. The fourth insulating layer L4 may be composed of a single layer or a plurality of layers, the fourth insulating layer L4 may include an organic material and/or an inorganic material.

The contact electrode CN may be disposed on the fourth insulating layer L4. Not only the contact electrode CN but also at least another portion of each of the signal lines (e.g., the scan or data lines) may be disposed on the fourth insulating layer L4. The contact electrode CN may be connected to the second output electrode OE2 through a penetration hole, which is formed to penetrate the fourth insulating layer L4.

A fifth insulating layer L5 may be disposed on the fourth insulating layer L4 to cover the contact electrode CN. The fifth insulating layer L5 may include an organic material. The light-emitting element ED, a first partition wall BR1, and a second partition wall BR2 may be disposed on the fifth insulating layer L5. The first partition wall BR1 and the second partition wall BR2 may include an organic material and may be spaced apart from each other in the first direction DR1.

The first electrode E1 may cover the first partition wall BR1, and the second electrode E2 may cover the second partition wall BR2. In other words, the first partition wall BR1 may be disposed between the first electrode E1 and the fifth insulating layer L5, and the second partition wall BR2 may be disposed between the second electrode E2 and the fifth insulating layer L5.

A penetration hole may be provided in the fifth insulating layer L5 to expose the contact electrode CN. The first electrode E1 may be electrically connected to the exposed contact electrode CN. Although not shown, the second electrode E2 may be electrically connected to the second power line PL2 of FIG. 2B. In other words, the second electrode E2 may be applied with the second power voltage ELVSS of FIG. 2B.

The first electrode E1 may include a first reflective electrode RFE1 and a first capping electrode CPE1. The second electrode E2 may include a second reflective electrode RFE2 and a second capping electrode CPE2. Each of the first reflective electrode RFE1 and the second reflective electrode RFE2 may include a reflective material. Each of the first reflective electrode RFE1 and the second reflective electrode RFE2 may have a single-layered structure or a stacking structure including a plurality of layers. For example, each of the first reflective electrode RFE1 and the second reflective electrode RFE2 may have a stacking structure, in which indium tin oxide (ITO), silver (Ag), and indium tin oxide (ITO) layers are sequentially stacked.

The first capping electrode CPE1 may cap the first reflective electrode RFE1, and the second capping electrode CPE2 may cap the second reflective electrode RFE2. For example, each of the first capping electrode CPE1 and the second capping electrode CPE2 may include at least one of indium zinc oxide (IZO), indium tin oxide (ITO), indium gallium oxide (IGO), indium zinc gallium oxide (IGZO), mixtures thereof, or compounds thereof.

The light-emitting element ED may be disposed between the first electrode E1 and the second electrode E2. In the first direction DR1, the light-emitting element ED may be spaced apart from each of the first electrode E1 and the second electrode E2. The light-emitting element ED may be electrically connected to the first electrode E1 through the first connection electrode CNE1. The first connection electrode CNE1 may be directly connected to the first electrode E1 and a first portion of the light-emitting element ED. Therefore, the first portion of the light-emitting element ED may receive the power signal, which is transferred from the second thin film transistor TR2, through the first connection electrode CNE1.

In addition, the light-emitting element ED may be electrically connected to the second electrode E2 through the second connection electrode CNE2. The second connection electrode CNE2 may be directly connected to the second electrode E2 and a second portion of the light-emitting element ED. Therefore, the second portion of the light-emitting element ED may receive the second power voltage ELVSS, which is transferred from the second power line PL2 of FIG. 2B, through the second connection electrode CNE2.

Examples in which the first connection electrode CNE1 and the second connection electrode CNE2 are directly connected to the first electrode E1 and the second electrode E2, respectively, have been described, but exemplary embodiments are not limited to these examples. For example, as shown in FIG. 4B, a first connection electrode in the first column, which is one of the plurality of the first connection electrodes CNE1a and is connected to an end of a first light-emitting element, may be connected to the second electrode E2. In this case, a second connection electrode CNE2a, which is connected to an opposite end of the first light-emitting element, may be connected to the first electrode E1. Whereas, a first connection electrode in the second column, which is one of the plurality of the first connection electrodes CNE1a and is connected to an end of a second light-emitting element adjacent to a first light-emitting element, may be connected to the first electrode E1. In this case, a second connection electrode CNE2a, which is connected to an opposite end of the second light-emitting element, may be connected to the first electrode E1.

The first connection electrode CNE1 and the second connection electrode CNE2 may include a conductive material. For example, the conductive material may include at least one of indium zinc oxide (IZO), indium tin oxide (ITO), indium gallium oxide (IGO), indium zinc gallium oxide (IGZO), mixtures thereof, or compounds thereof. However, the inventive concept is not limited to this example. For example, the conductive material may be a metallic material, which includes, for example, molybdenum, silver, titanium, copper, aluminum, or alloys thereof.

According to an exemplary embodiment, a first auxiliary insulating layer LX1 may be disposed on the light-emitting element ED, and a second auxiliary insulating layer LX2 may be disposed on the first auxiliary insulating layer LX1. The first auxiliary insulating layer LX1 may be disposed between the second auxiliary insulating layer LX2 and the light-emitting element ED. The dummy connection electrode CNEd may be disposed on the second auxiliary insulating layer LX2. Since, as shown in FIG. 5, the dummy connection electrode CNEd is electrically disconnected from the first connection electrode CNE1 and the second connection electrode CNE2, the first connection electrode CNE1 and the second connection electrode CNE2 may not be electrically coupled to each other.

In detail, referring to FIG. 6, when viewed in a plan view parallel to a top surface of the first base layer BL1, the light-emitting element ED may have a first width, the first auxiliary insulating layer LX1 may have a second width, and the second auxiliary insulating layer LX2 may have a third width. In an exemplary embodiment, when viewed in the plan view, the second width of the first auxiliary insulating layer LX1 may be smaller than the third width of the second auxiliary insulating layer LX2. In addition, when viewed in a plan view, the third width of the second auxiliary insulating layer LX2 may be smaller than the first width of the light-emitting element ED.

As shown in FIG. 6, when measured in the first direction DR1, the first width of the light-emitting element ED may be provided to have a first length D1, the second width of the first auxiliary insulating layer LX1 may be provided to have a second length D2, and the third width of the second auxiliary insulating layer LX2 may be provided to have a third length D3. The second length D2 may be shorter than the third length D3, and the third length D3 may be shorter than the first length D1.

According to the above description, when viewed in the plan view, the second auxiliary insulating layer LX2 may be entirely overlapped with the light-emitting element ED, and may be partially overlapped with the first auxiliary insulating layer LX1.

According to an exemplary embodiment, after the formation of the first auxiliary insulating layer LX1 and the second auxiliary insulating layer LX2, a conductive deposition material may be provided to form the connection electrode CNE. In this case, the first auxiliary insulating layer LX1 may be overlapped and/or covered with the second auxiliary insulating layer LX2, and thus, the deposition material may be deposited on the first electrode E1, the second electrode E2, the second auxiliary insulating layer LX2, and a portion of the light-emitting element ED, but not on the first auxiliary insulating layer LX1.

As a result, the first auxiliary insulating layer LX1 and the second auxiliary insulating layer LX2 may be provided with a structure that defines an under-cut region UC (shown in the circled areas in region AA of FIG. 5). The under-cut region may be an empty region, which is formed between the first and second auxiliary insulating layers LX1 and LX2 and is defined by a side surface of the first auxiliary insulating layer LX1 inwardly recessed from a side surface of the second auxiliary insulating layer LX2.

In detail, the second auxiliary insulating layer LX2 may include a first insulating portion LX2a, which is overlapped with the first auxiliary insulating layer LX1, and a second insulating portion LX2b, which is extended from and disposed around the first insulating portion LX2a, when viewed in a plan view. The second insulating portion LX2b may enclose (or surround) the first auxiliary insulating layer LX1 in a plan view. The second insulating portion LX2b may not be overlapped with the first auxiliary insulating layer LX1. The dummy connection electrode CNEd may be disposed over substantially the entire upper surfaces of the first insulating portion LX2a and the second insulating portion LX2b and may further be disposed on the side surfaces of the the second insulating portion LX2b.

When measured in the third direction DR3, a separation distance SR between the second auxiliary insulating layer LX2 and the first connection electrode CNE1 disposed on the light-emitting element ED may be substantially equal to a separation distance SR between the second auxiliary insulating layer LX2 and the second connection electrode CNE2 disposed on the light-emitting element ED.

The dummy connection electrode CNEd may be disposed on only the second auxiliary insulating layer LX2.

According to an exemplary embodiment, the first connection electrode CNE1, the second connection electrode CNE2, and the dummy connection electrode CNEd may be formed through a single deposition process. For example, by performing a deposition process once, it may be possible to form the dummy connection electrode CNEd on the second auxiliary insulating layer LX2 and to form the first connection electrode CNE1 and the second connection electrode CNE2, which are respectively disposed on the first electrode E1 and the second electrode E2 and are separated from the dummy connection electrode CNEd by the first auxiliary insulating layer LX1. As such, the stacked structure of the first and second auxiliary insulating layers LX1 and LX2 may enable the dummy connection electrode CNEd to be spaced apart from the first and second connection electrode CNE1 and CNE2, and therefore the first and second connection electrode CNE1 and CNE2 may be formed, along with the dummy connection electrode CNEd, through the same deposition process.

Referring back to FIG. 5, a sixth insulating layer L6 (or an insulating pattern) may be disposed on the light-emitting element ED. The sixth insulating layer L6 may cover the first connection electrode CNE1, the second connection electrode CNE2, and the dummy connection electrode CNEd. In an exemplary embodiment, the sixth insulating layer L6 may be omitted.

A light-blocking layer BM may be disposed on a surface of the second base layer BL2 facing the first base layer BL1. An opening may be provided in the light-blocking layer BM, and a wavelength conversion part CL may cover the opening. A region exposed by the opening may correspond to a pixel light-emitting region PXA.

The wavelength conversion part CL may include a light emitter. The light emitter may absorb a first light provided from the light-emitting element ED and may emit a second color light, whose color or wavelength is converted to be different from that of the first light. The light emitter may be, for example, a quantum dot. The first light may be a blue light, and the second color light may be a green or red light. However, exemplary embodiments are not limited to this example. In an exemplary embodiment, the wavelength conversion part CL may be replaced with a color filter. The color filter may absorb light of a specific wavelength to realize a desired color. In an exemplary embodiment, the wavelength conversion part CL may be omitted. In this case, the light-emitting element ED may emit a blue, green, or red light.

A seventh insulating layer L7 may be disposed between the wavelength conversion part CL and the sixth insulating layer L6. For example, the first base layer BL1, on which the pixel circuit PXC of FIG. 2B and the light-emitting element ED are disposed, may be coupled to the second base layer BL2, on which the wavelength conversion part CL and the light-blocking layer BM is disposed, by the seventh insulating layer L7. In an exemplary embodiment, the seventh insulating layer L7 may be, for example, an optically clear adhesive (OCA) film, an optically clear resin (OCR), or a pressure sensitive adhesive (PSA) film.

FIG. 7A to 7D are sectional views of exemplary embodiments of a light-emitting element of FIG. 6.

Figure 7A:
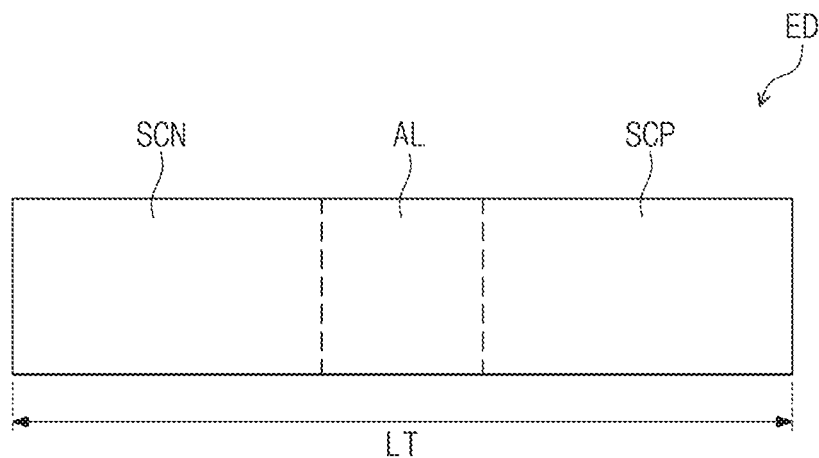
FIG. 7A to 7D are sectional views of exemplary embodiments of a light-emitting element of FIG. 6.

Referring to FIG. 7A, the light-emitting element ED may have various shapes including a circular pillar-type shape or a polygonal pillar-type shape.

The light-emitting element ED may include an n-type semiconductor layer SCN, a p-type semiconductor layer SCP, and an active layer AL. The active layer AL may be disposed between the n-type semiconductor layer SCN and the p-type semiconductor layer SCP.

The n-type semiconductor layer SCN may be provided by doping a semiconductor layer with n-type dopants, and the p-type semiconductor layer SCP may be provided by doping a semiconductor layer with p-type dopants. The semiconductor layer may include a semiconductor material, which may be at least one of, for example, GaN, AlN, AlGaN, InGaN, InN, InAlGaN, or AlInN, but exemplary embodiments are not limited to these examples. The n-type dopants may be at least one of silicon (Si), germanium (Ge), tin (Sn), selenium (Se), tellurium (Te), but exemplary embodiments are not limited to this example. The p-type dopants may be at least one of magnesium (Mg), zinc (Zn), calcium (Ca), strontium (Sr), or barium (Ba), but exemplary embodiments are not limited to these examples.

The active layer AL may be formed to have at least one of a single quantum well structure, a multiple quantum well structure, a quantum rod structure, or a quantum dot structure. The active layer AL may be a region, in which electrons injected through the n-type semiconductor layer SCN are recombined with holes injected through the p-type semiconductor layer SCP. The active layer AL may be a layer emitting light, whose energy is determined by an energy band of a material. The position of the active layer AL may be variously changed, depending on the kind of the diode.

The n-type semiconductor layer SCN may be coupled to one of the first electrode E1 and the second electrode E2 shown in FIG. 5, and the p-type semiconductor layer SCP may be coupled to the other of the first electrode E1 and the second electrode E2.

A length LT of the light-emitting element ED may range from several nanometers to several hundred micrometers. For example, the length LT of the light-emitting element ED may range from 1 micrometer to 100 micrometers.

Figure 7B:
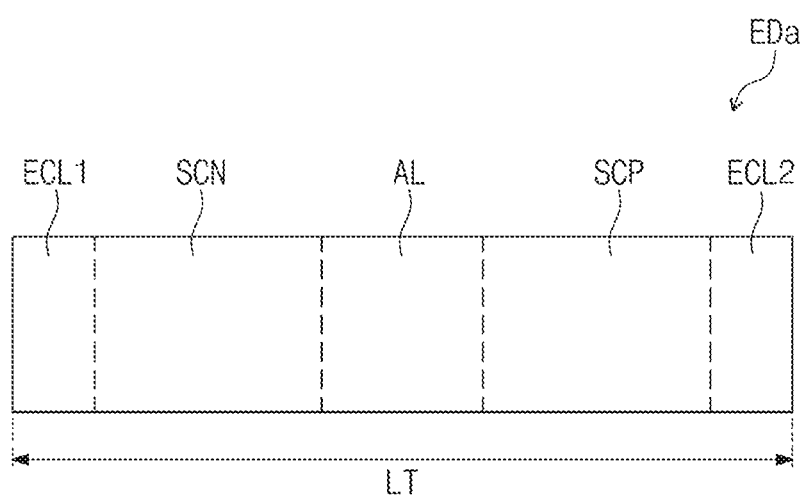

Referring to FIG. 7B, a light-emitting element EDa may further include a first electrode layer ECL1 and a second electrode layer ECL2, when compared with the light-emitting element ED of FIG. 7A.

The first electrode layer ECL1 may be adjacent to the n-type semiconductor layer SCN, and the second electrode layer ECL2 may be adjacent to the p-type semiconductor layer SCP. In an exemplary embodiment, the first electrode layer ECL1, the n-type semiconductor layer SCN, the active layer AL, the p-type semiconductor layer SCP, and the second electrode layer ECL2 may be sequentially stacked.

Each of the first electrode layer ECL1 and the second electrode layer ECL2 may be formed of or include at least one of metallic materials or metal alloys. For example, each of the first electrode layer ECL1 and the second electrode layer ECL2 may be formed of a metallic material, which is selected from molybdenum (Mo), chromium (Cr), nickel (Ni), gold (Au), aluminum (Al), titanium (Ti), platinum (Pt), vanadium (V), tungsten (W), lead (Pd), copper (Cu), rhodium (Rh), and iridium (Ir), or an alloy containing at least one of the metallic elements. The first electrode layer ECL1 and the second electrode layer ECL2 may include the same material, but in an exemplary embodiment, the first electrode layer ECL1 and the second electrode layer ECL2 may include different materials from each other.

Figure 7C:
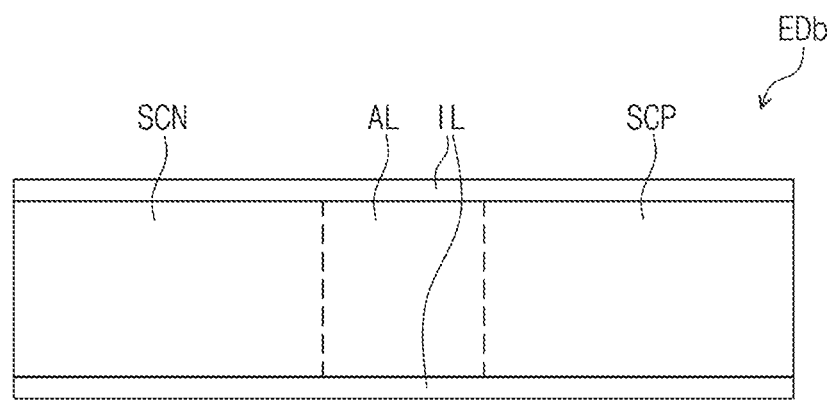

Referring to FIG. 7C, a light-emitting element EDb may further include an insulating layer IL, when compared with the light-emitting element ED of FIG. 7A. For example, the light-emitting element EDb may be a core-shell structure.

The insulating layer IL may cover the n-type semiconductor layer SCN, the p-type semiconductor layer SCP, and the active layer AL and may protect outer surfaces of the n-type semiconductor layer SCN, the p-type semiconductor layer SCP, and the active layer AL. In an exemplary embodiment, the insulating layer IL may be locally disposed to cover the active layer AL, but not the n-type semiconductor layer SCN and the p-type semiconductor layer SCP.

Figure 7D:
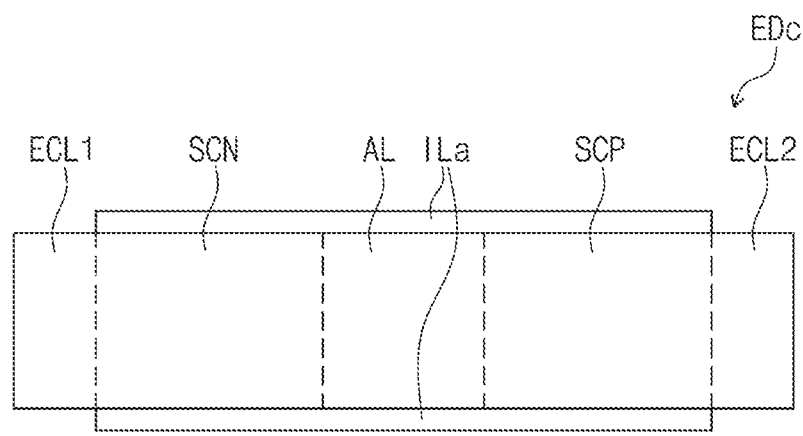

Referring to FIG. 7D, a light-emitting element EDc may further include an insulating layer ILa, when compared with the light-emitting element EDa of FIG. 7B.

The insulating layer ILa may cover the n-type semiconductor layer SCN, the p-type semiconductor layer SCP, and the active layer AL but not cover a first electrode EL1 and a second electrode EL2. However, in an exemplary embodiment, the insulating layer ILa may cover at least a portion of the first electrode EL1 and the second electrode EL2 or may cover both of the first electrode EL1 and the second electrode EL2.

FIGS. 8A to 8H are sectional views of a portion of an exemplary embodiment of a display panel illustrating some steps of a process of fabricating the display panel according to the principles of the invention. For concise description, an element previously described with reference to FIG. 5 may be identified by a similar or identical reference number without repeating a repetitive description thereof. Especially, a method of forming the first connection electrode CNE1, the second connection electrode CNE2, and the dummy connection electrode CNEd using a single deposition process will be described with reference in more detail to FIGS. 8A to 8H.

Figure 8A:
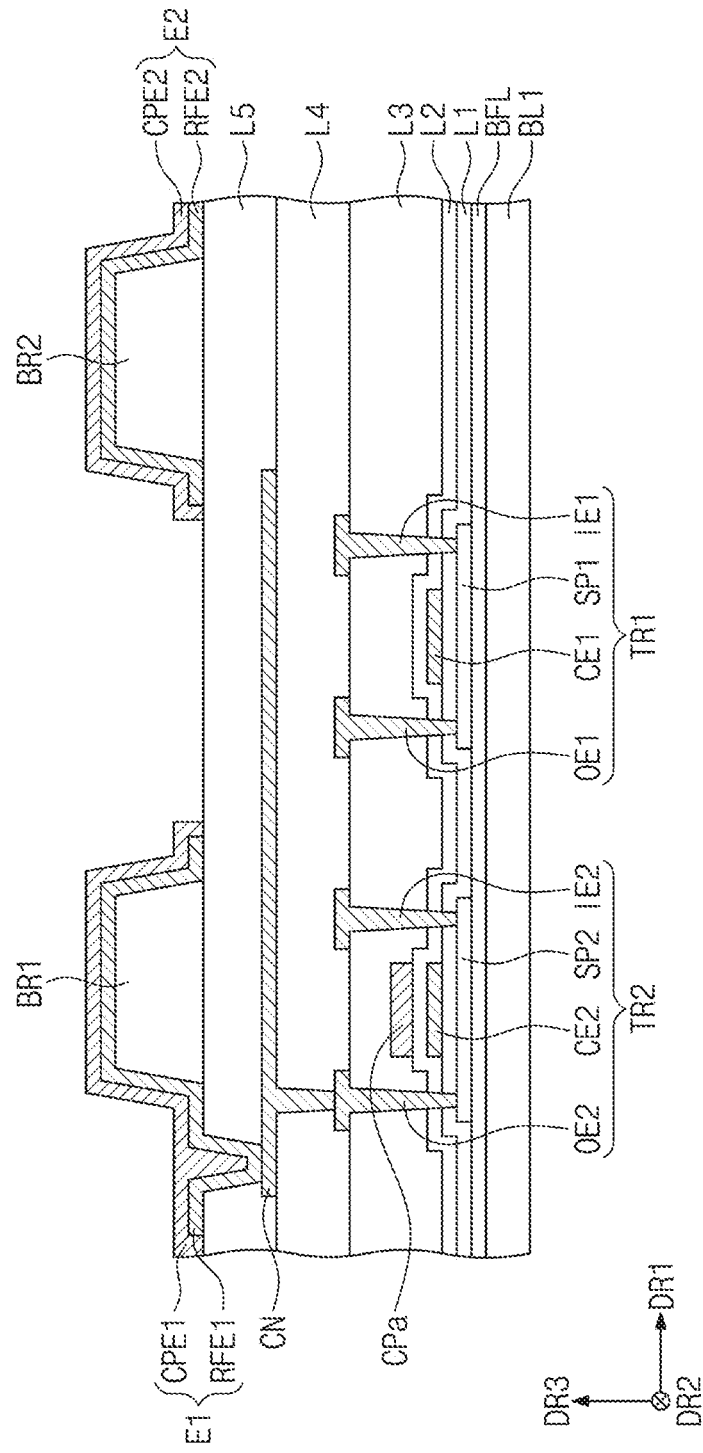
FIGS. 8A to 8H are sectional views of a portion of an exemplary embodiment of a display panel illustrating some steps of a process of fabricating the display panel according to the principles of the invention.

First, as shown in FIG. 8A, the pixel circuit PXC of FIG. 2B may be formed on the first base layer BL1, and then, the fifth insulating layer L5 may be formed to cover the pixel circuit PXC. Although the process is not shown, the first to fourth insulating layers L1, L2, L3, and L4 may be formed during the process of forming the pixel circuit PXC.

Referring to FIG. 8A, the first electrode E1 and the second electrode E2 may be disposed on the fifth insulating layer L5. In an exemplary embodiment, the first partition wall BR1 may be disposed between the first electrode E1 and the fifth insulating layer L5 and may be covered with the first electrode E1. The second partition wall BR2 may be disposed between the second electrode E2 and the fifth insulating layer L5 and may be covered with the second electrode E2.

Figure 8B:
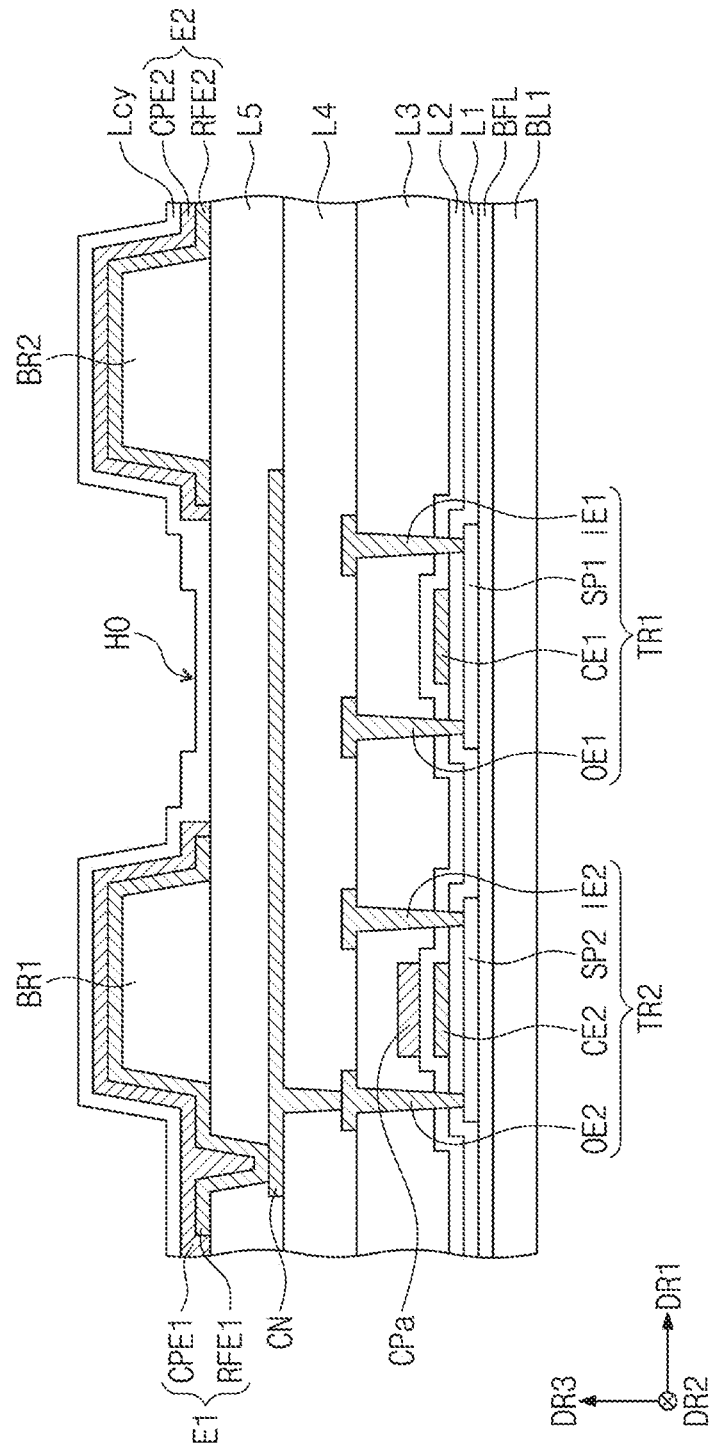

Referring to FIG. 8B, an auxiliary insulating layer Lcy may be formed on the fifth insulating layer L5 to cover the first electrode E1 and the second electrode E2. As shown in FIG. 8B, a portion of the auxiliary insulating layer Lcy, which is disposed between the first partition wall BR1 and the second partition wall BR2, may be partially removed, after the formation of the auxiliary insulating layer Lcy on the fifth insulating layer L5. For example, the portion of the auxiliary insulating layer Lcy may be recessed in the third direction DR3. As a result, the auxiliary insulating layer Lcy has a recess portion HO.

In the case where the light-emitting element ED is formed, the light-emitting element ED may be electrically disconnected from the first electrode E1 and the second electrode E2 by the auxiliary insulating layer Lcy. The auxiliary insulating layer Lcy may enable the light-emitting element ED to be arranged effectively and/or efficiently in a desired position where the recess portion HO is formed. However, exemplary embodiments are not limited to this example, and in an exemplary embodiment, the auxiliary insulating layer Lcy may be omitted. In this case, the light-emitting element ED may be directly formed on the fifth insulating layer L5.

Figure 8C:
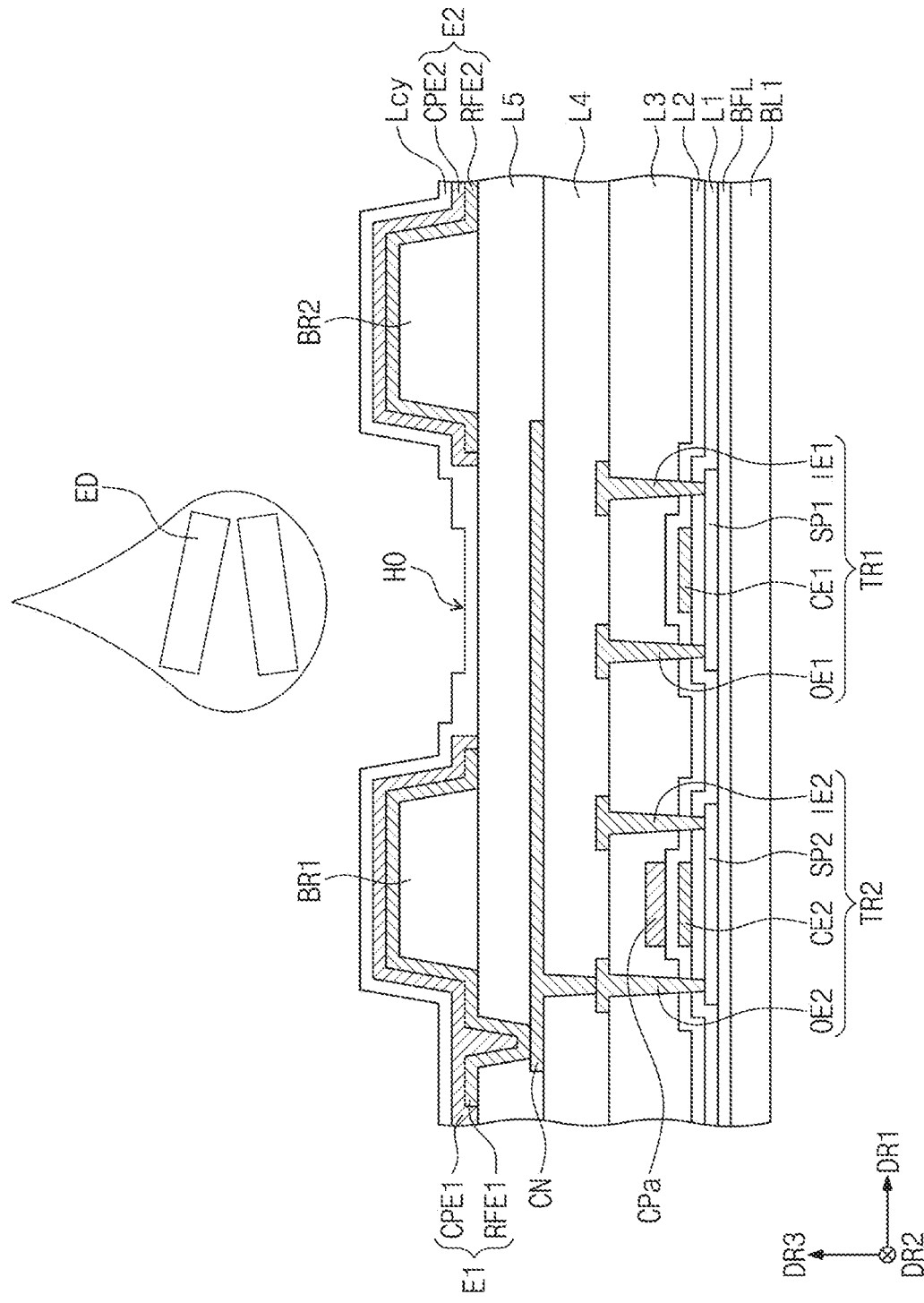

Referring to FIG. 8C, solvent (e.g., ink, or paste) containing the light-emitting element ED may be provided on the recess region HO. The solvent may be a material that can be evaporated in a room temperature or by heat. An electric power may be applied to the first electrode E1 and the second electrode E2 to form an electric field between the first electrode E1 and the second electrode E2. Owing to the electric field, a dipole may be induced in the light-emitting element ED, and the light-emitting element ED may be aligned between the first electrode E1 and the second electrode E2 by a dielectrophoretic force.

In an exemplary embodiment, portions of the auxiliary insulating layer Lcy of FIG. 8C, except for a portion between the first electrode E1 and the second electrode E2, may be patterned or removed. As a result, an auxiliary insulating layer Lc exposing the first electrode E1 and the second electrode E2 may be formed between the first electrode E1 and the second electrode E2. At least a portion of the auxiliary insulating layer Lc may be disposed between the light-emitting element ED and the fifth insulating layer L5.

Figure 8D:
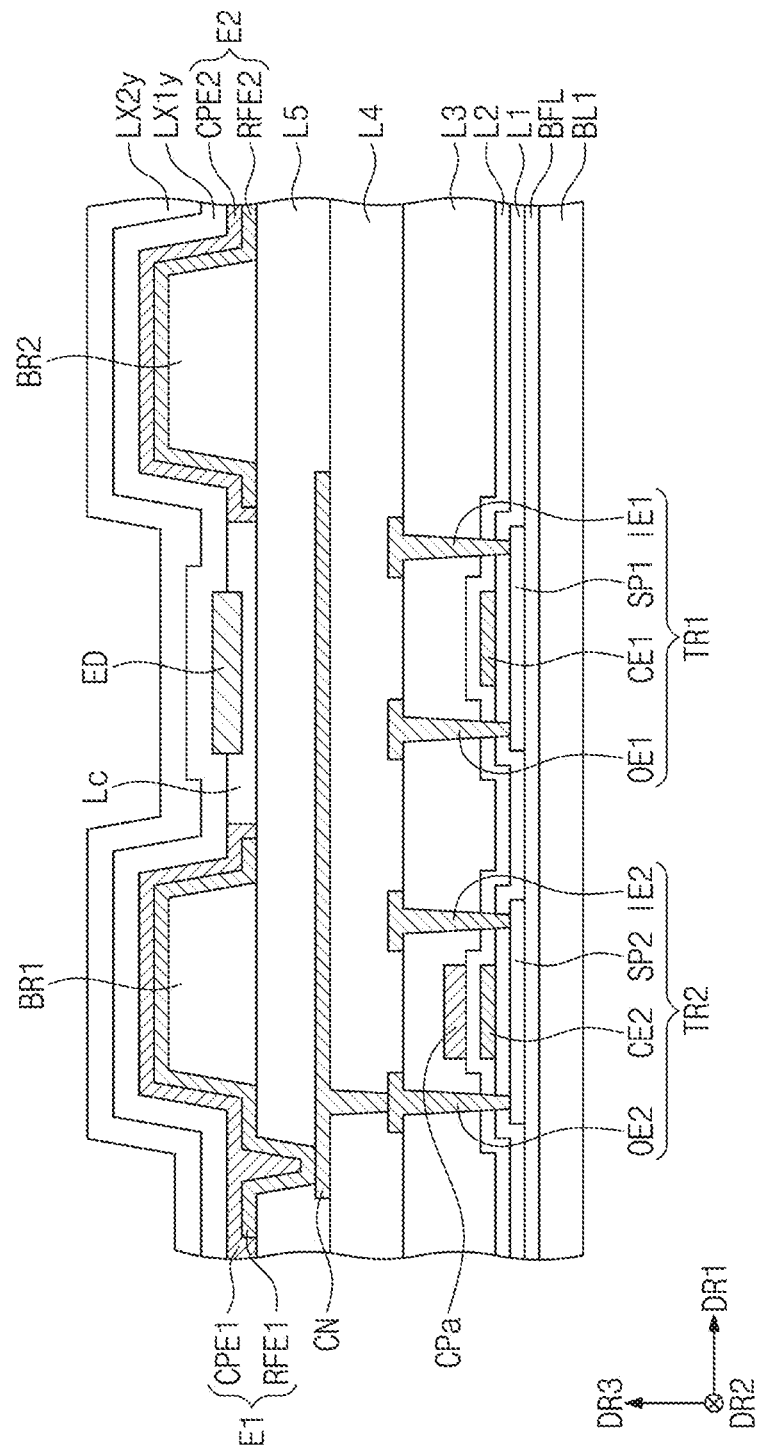

Referring to FIG. 8D, a first auxiliary layer LX1y may be formed on the auxiliary insulating layer Lc to cover the first electrode E1, the second electrode E2, and the light-emitting element ED. A second auxiliary layer LX2y may be formed on the first auxiliary layer LX1y.

Figure 8E:
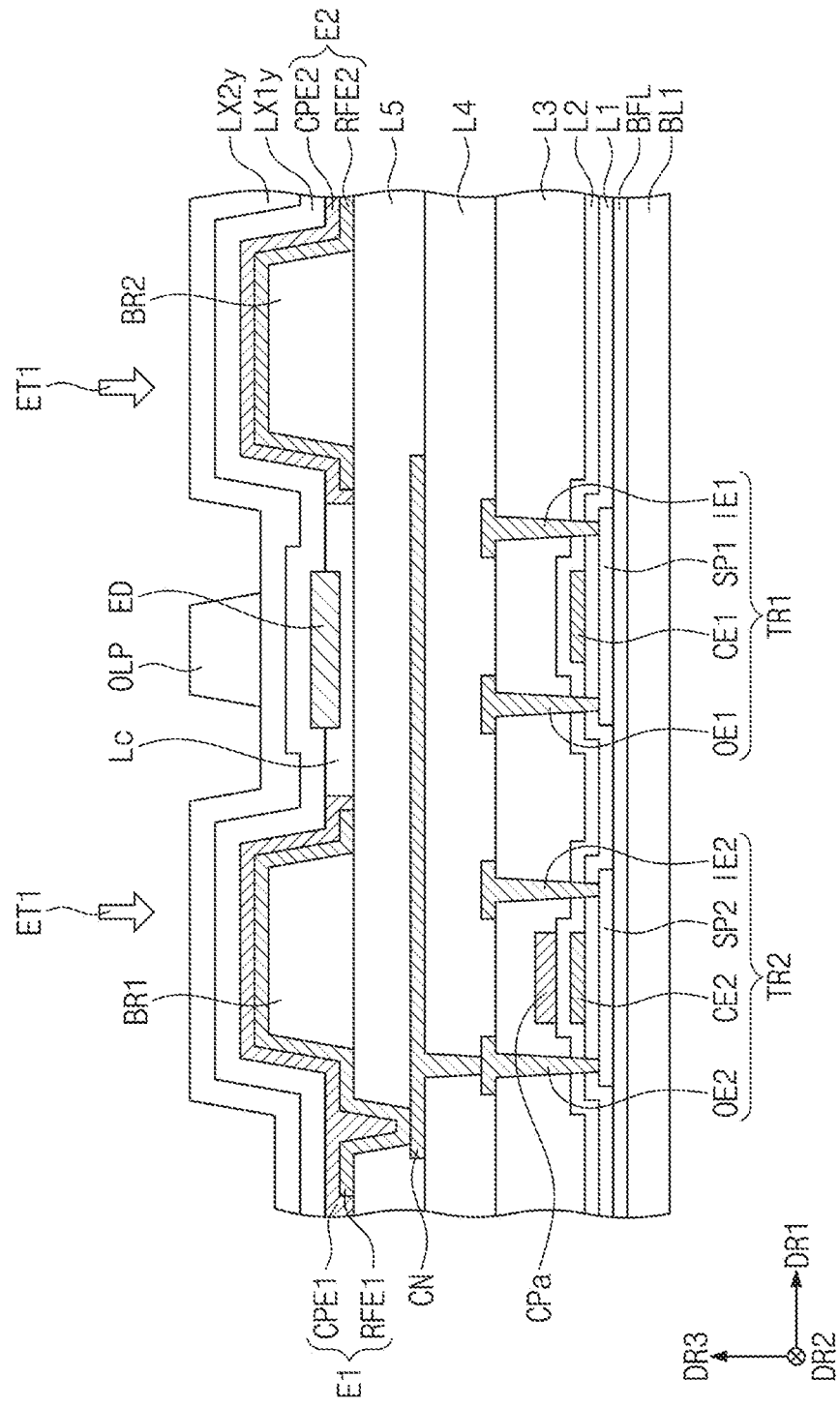

Referring to FIG. 8E, a photoresist pattern OLP may be formed on the second auxiliary layer LX2y to be overlapped with the light-emitting element ED. The photoresist pattern OLP may be formed by forming a positive or negative photoresist layer and patterning the positive or negative photoresist layer. For example, the photoresist pattern OLP may be formed to cover a portion of the second auxiliary layer LX2y overlapping the light-emitting element ED and to expose the other portion of the second auxiliary layer LX2y.

According to an exemplary embodiment, after the formation of the photoresist pattern OLP, the exposed portion of the second auxiliary layer LX2y may be removed by, for example, a first etching gas ET1.

Figure 8F:
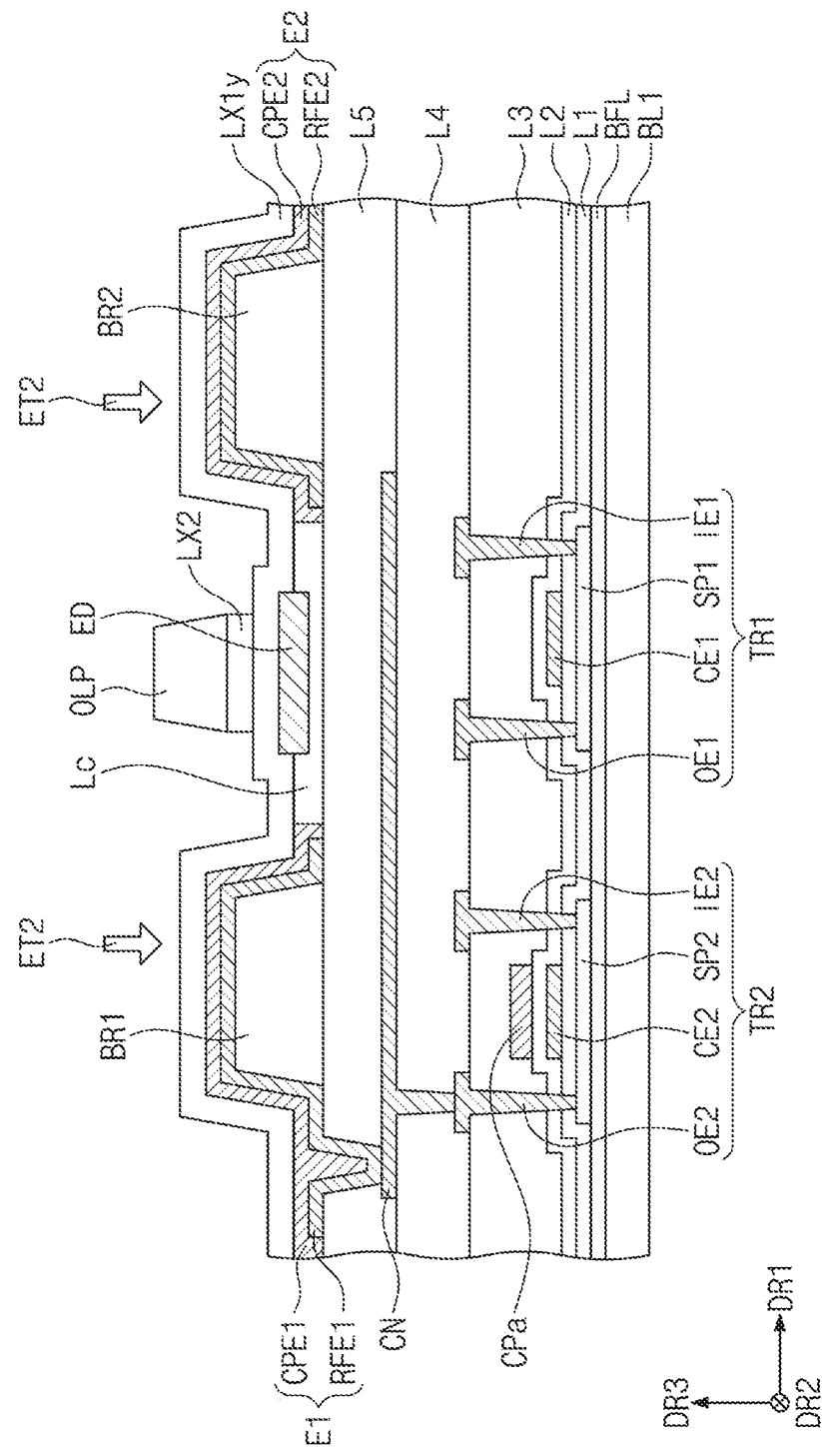

Referring to FIG. 8F, as a result of the removal of the second auxiliary layer LX2y using the first etching gas ET1, the second auxiliary insulating layer LX2 may be formed to have the structure shown in FIG. 6. Since the second auxiliary insulating layer LX2 is formed by removing a portion of the second auxiliary layer LX2y, the first auxiliary layer LX1y may be exposed to the outside. In other words, a portion of the first auxiliary layer LX1y may be covered with the second auxiliary insulating layer LX2, and the remaining portion of the first auxiliary layer LX1y may be exposed to the outside.

According to an exemplary embodiment, the remaining portion of the first auxiliary layer LX1y exposed to the outside may be removed by, for example, a second etching gas ET2. In an exemplary embodiment, the second etching gas ET2 may be substantially the same material as the first etching gas ET1.

Figure 8G:
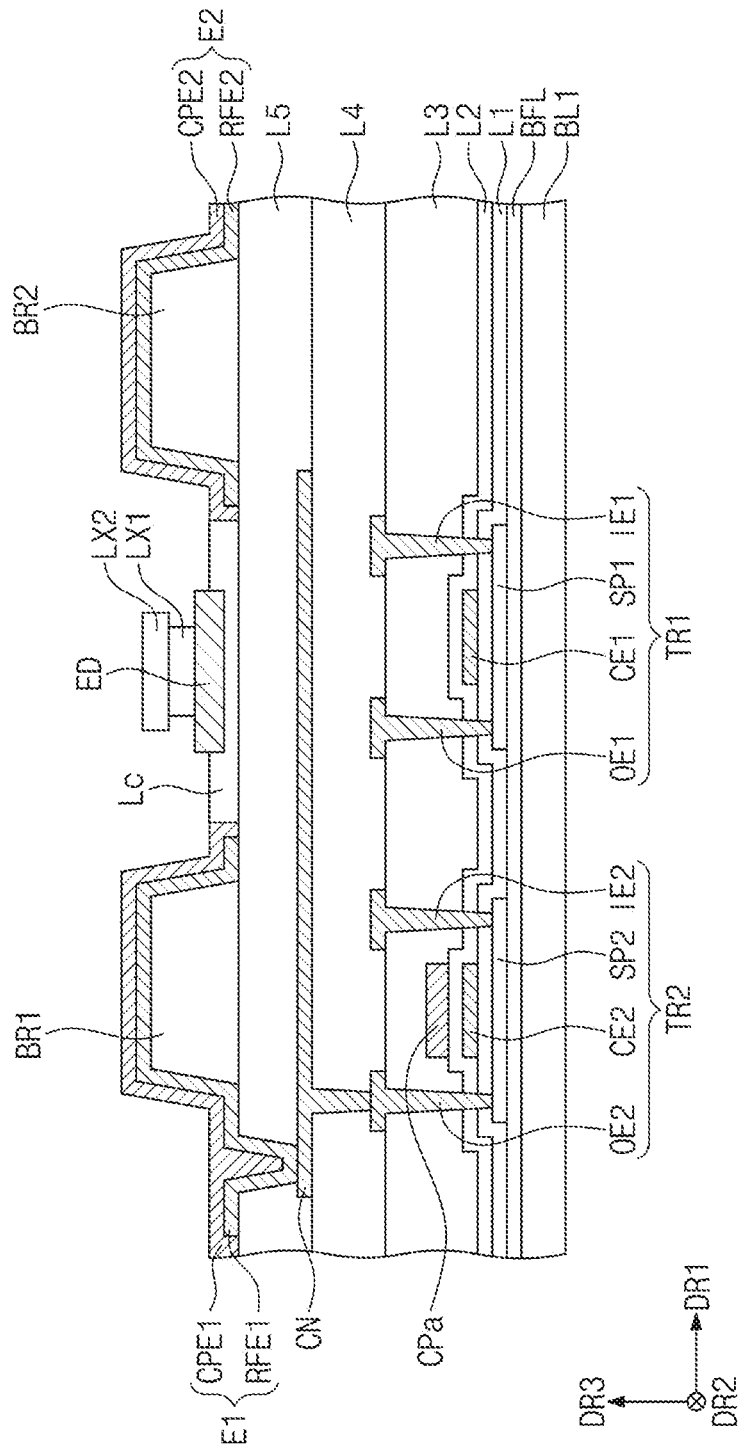

Referring to FIG. 8G, in the case where the remaining portion of the first auxiliary layer LX1y is removed by the second etching gas ET2, the first auxiliary insulating layer LX1 may be formed to have the structure shown in FIG. 6. Thereafter, the photoresist pattern OLP may be removed.

According to an exemplary embodiment, the first auxiliary insulating layer LX1 may be selectively etched with an etch selectivity with respect to the second auxiliary insulating layer LX2. For example, the first auxiliary insulating layer LX1 may be etched in a rate higher than that of the second auxiliary insulating layer LX2. In an exemplary embodiment, the first auxiliary insulating layer LX1 and the second auxiliary insulating layer LX2 may be formed of different materials, and in this case, the difference in etch rate between the first and second auxiliary layers LX1 and LX2 may be more easily realized.

According to an exemplary embodiment, the first auxiliary insulating layer LX1 may include SiOx, and the second auxiliary insulating layer LX2 may include SiNx. In the case where the first auxiliary layer LX1y and the second auxiliary layer LX2y are etched by the same etching gas (e.g., a fluorine-containing gas), an etch rate of the first auxiliary layer LX1y may be higher than that of the second auxiliary layer LX2y.

However, exemplary embodiments are not limited to specific materials of the first auxiliary insulating layer LX1 and the second auxiliary insulating layer LX2. In other words, various materials capable of realizing a sufficiently large difference in etch rate between the first and second auxiliary insulating layers LX1 and LX2 may be used as materials for the first auxiliary insulating layer LX1 and the second auxiliary insulating layer LX2.

Thus, as shown in FIG. 8G, the first auxiliary insulating layer LX1 and the second auxiliary insulating layer LX2 may be formed to define an under-cut shaped region. For example, the first auxiliary insulating layer LX1 may be entirely overlapped and/or covered with the second auxiliary insulating layer LX2, and the first auxiliary insulating layer LX1 may be formed to have a width smaller than a width of the second auxiliary insulating layer LX2.

Figure 8H:
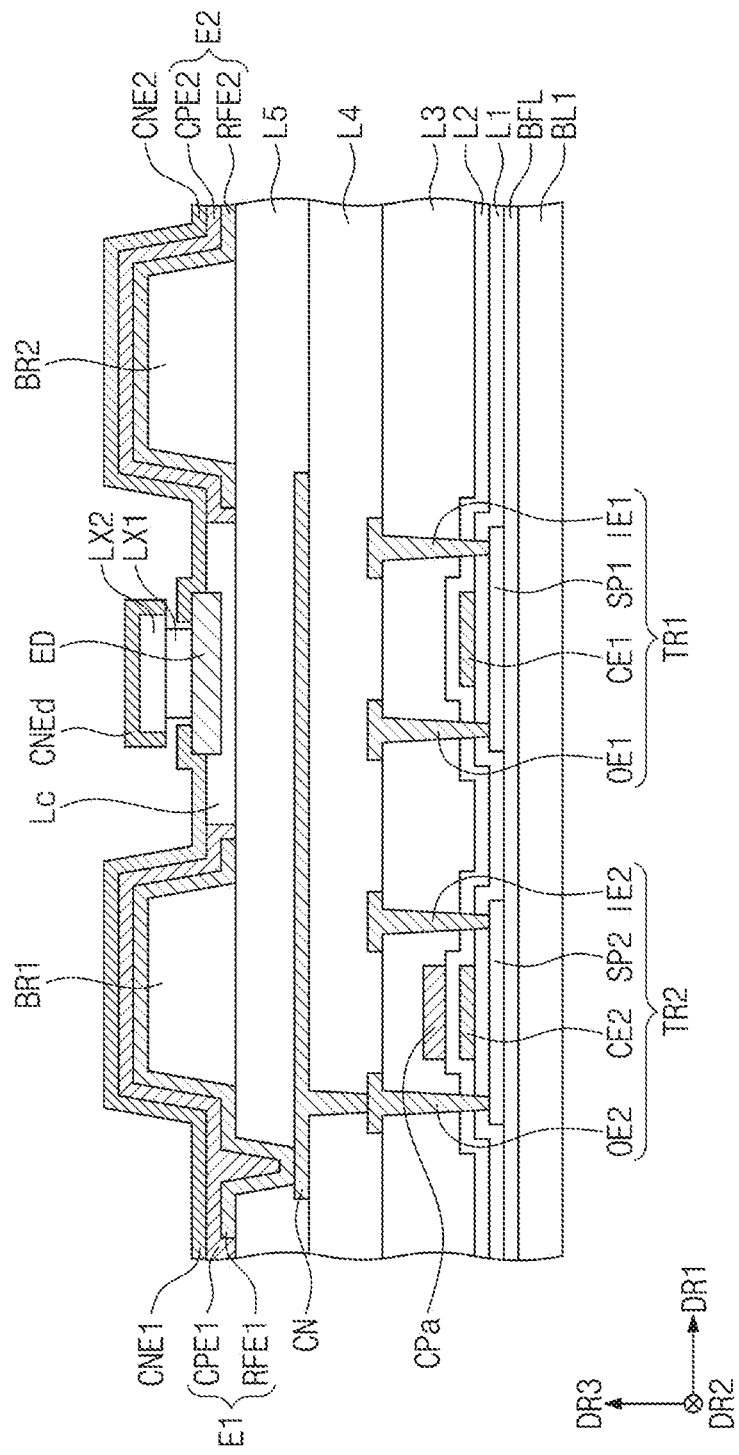

Referring to FIG. 8H, the first connection electrode CNE1, the second connection electrode CNE2, and the dummy connection electrode CNEd may be formed at the same time. Here, the first connection electrode CNE1 may be formed to connect the first electrode E1 and the light-emitting element ED, the second connection electrode CNE2 may be formed to connect the second electrode E2 and the light-emitting element ED, and the dummy connection electrode CNEd may be provided on the second auxiliary insulating layer LX2.

For example, a conductive layer may be formed on the first electrode E1, the second electrode E2, the light-emitting element ED, and the second auxiliary insulating layer LX2. In an exemplary embodiment, the conductive layer may include a conductive material, such as indium tin oxide (ITO) or silver (Ag).

According to an exemplary embodiment, the first auxiliary insulating layer LX1 may be entirely overlapped and/or covered with the second auxiliary insulating layer LX2. The conductive material may not be deposited on the first auxiliary insulating layer LX1 by the second auxiliary insulating layer LX2. Thus, the conductive layer may be used as the dummy connection electrode CNEd, which is disposed on the second auxiliary insulating layer LX2, the first connection electrode CNE1, which is deposited on the first electrode E1 and a portion of the light-emitting element ED, and the second connection electrode CNE2, which is deposited on the second electrode E2 and another portion of the light-emitting element ED.

In particular, the dummy connection electrode CNEd may be electrically separated from the first connection electrode CNE1 and the second connection electrode CNE2 by the first auxiliary insulating layer LX1. Thus, the first connection electrode CNE1 and the second connection electrode CNE2 may also be electrically separated from each other.

According to an exemplary embodiment, a first connection electrode connecting a first electrode to a light-emitting element and a second connection electrode connecting a second electrode and the light-emitting element may be simultaneously formed through a single deposition process.

Thus, it may be possible to reduce time and cost in a process of fabricating a display device.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
   a base layer;
   a pixel circuit disposed on the base layer;
   an insulating layer disposed on the base layer covering the pixel circuit;
   a first electrode electrically connected to the pixel circuit and disposed on the insulating layer;
   a second electrode electrically connected to the pixel circuit and disposed on the insulating layer, the second electrode being spaced apart from the first electrode in a first direction;
   a light-emitting element disposed between the first electrode and the second electrode and electrically connected to the first electrode and the second electrode;
   a connection electrode connecting the first electrode and the light-emitting element and connecting the second electrode and the light-emitting element;
   a first auxiliary insulating layer disposed on the light-emitting element; and
   a second auxiliary insulating layer made of a different material than the first auxiliary insulating layer, the second auxiliary insulating layer being disposed on the first auxiliary insulating layer such that the first auxiliary insulating layer is disposed between the second auxiliary insulating layer and the light-emitting element,
   wherein the second auxiliary insulating layer comprises a first insulating portion overlapped with the first auxiliary insulating layer, and a second insulating portion disposed outwardly from the first insulating portion and not overlapping the first auxiliary insulating layer.

2. The display device of claim 1, wherein a width of the first auxiliary insulating layer is smaller than a width of the second auxiliary insulating layer.

3. The display device of claim 2, wherein the width of the second auxiliary insulating layer is smaller than a width of the light-emitting element,
   the first auxiliary insulating layer is entirely overlapped by the second auxiliary insulating layer, and
   the second auxiliary insulating layer is entirely overlapped by the light-emitting element.

4. The display device of claim 1, wherein the first auxiliary insulating layer comprises SiOx, and the second auxiliary insulating layer comprises SiNx.

5. The display device of claim 1, wherein, when measured in a thickness direction of the base layer, a distance separating the first insulating portion from the light-emitting element is substantially equal to a distance separating the second insulating portion and the light-emitting element.

6. The display device of claim 1, wherein the connection electrode comprises:
   a dummy connection electrode disposed on the second auxiliary insulating layer;
   a first connection electrode connecting the first electrode and the light-emitting element; and
   a second connection electrode connecting the second electrode and the light-emitting element, the first and second connection electrodes being spaced apart from each other,
   wherein the dummy connection electrode is spaced apart from the first connection electrode and the second connection electrode.

7. The display device of claim 6, wherein the first connection electrode and the second connection electrode are spaced apart from each other with the first auxiliary insulating layer being interposed therebetween, and wherein the dummy connection electrode, the first connection electrode, and the second connection electrode comprise a same conductive material.

8. The display device of claim 6, wherein, when measured in a thickness direction of the base layer, a distance separating the second auxiliary insulating layer and the first connection electrode disposed on the light-emitting element is substantially equal to a distance separating the second auxiliary insulating layer and the second connection electrode disposed on the light-emitting element.

9. The display device of claim 6, wherein the dummy connection electrode covers at least three intersecting surfaces of the second auxiliary insulating layer.

10. The display device of claim 1, wherein, the connection electrode overlaps the light-emitting element.

11. The display device of claim 1, further comprising:
a first partition wall disposed between the first electrode and the insulating layer; and
a second partition wall disposed between the second electrode and the insulating layer,
wherein the light-emitting element is disposed between the first partition wall and the second partition wall.

12. The display device of claim 1, wherein the first electrode comprises a first reflective electrode, which is electrically connected to the pixel circuit and includes a reflective material, and a first capping electrode, which covers the first reflective electrode, and
the second electrode comprises a second reflective electrode, which receives a power voltage and includes a reflective material, and a second capping electrode, which covers the second reflective electrode.

13. The display device of claim 1, further comprising a third auxiliary insulating layer disposed on the light-emitting element and the insulating layer,
wherein a portion of the third auxiliary insulating layer is recessed in a thickness direction of the base layer.

14. The display device of claim 1, wherein the connection electrode is disposed on the first electrode and the second electrode.

15. The display device of claim 1, wherein the connection electrode is directly disposed on a top surface and a side surface of the light-emitting element.

16. A display device, comprising:
a base layer;
a pixel circuit disposed on the base layer;
an insulating layer disposed on the base layer to cover the pixel circuit;
a first electrode electrically connected to the pixel circuit and disposed on the insulating layer;
a second electrode electrically connected to the pixel circuit and disposed on the insulating layer, the second electrode being spaced apart from the first electrode in a first direction;
a light-emitting element disposed between the first electrode and the second electrode and electrically connected to the first electrode and the second electrode;
a first auxiliary insulating layer disposed on the light-emitting element;
a second auxiliary insulating layer made of a different material than the first auxiliary insulating layer, the second auxiliary insulating layer being disposed on the first auxiliary insulating layer such that the first auxiliary insulating layer is disposed between the second auxiliary insulating layer and the light-emitting element; and a connection electrode comprising a dummy connection electrode disposed on the second auxiliary insulating layer, a first connection electrode connecting the first electrode and the light-emitting element, and a second connection electrode connecting the second electrode and the light-emitting element, the second connection electrode being spaced apart from the first connection electrode.

17. The display device of claim 14, wherein the dummy connection electrode is spaced apart from the first connection electrode and the second connection electrode and is substantially disposed over the second auxiliary insulating layer, and
wherein the dummy connection electrode, the first connection electrode, and the second connection electrode comprise a same conductive material.

18. The display device of claim 14, wherein a width of the first auxiliary insulating layer is smaller than a width of the second auxiliary insulating layer, and the width of the second auxiliary insulating layer is smaller than a width of the light-emitting element.

19. The display device of claim 16, wherein the dummy electrode is directly disposed on a top surface and a side surface of the second auxiliary insulating layer.

20. A method of fabricating a display device, the method comprising steps of:
forming a pixel circuit on a base layer;
forming an insulating layer on the base layer to cover the pixel circuit;
forming a first electrode and a second electrode spaced apart from each other, and a light-emitting element disposed between the first electrode and the second electrode, on the insulating layer;
forming a first auxiliary layer on the insulating layer covering the light-emitting element;
forming a second auxiliary layer on the first auxiliary layer;
forming a photoresist pattern on the second auxiliary layer overlapped with the light-emitting element;
removing a portion of the second auxiliary layer, which is exposed from the photoresist pattern, using a first gas to form a second auxiliary insulating layer;
removing a portion of the first auxiliary layer, which is exposed from the second auxiliary insulating layer, using a second gas to form a first auxiliary insulating layer; and
depositing a conductive material to simultaneously form a first connection electrode connecting the first electrode and the light-emitting element, a second connection electrode connecting the second electrode and the light-emitting element, and a dummy connection electrode disposed on the second auxiliary insulating layer.

21. The method of claim 20, wherein an etch rate of the first auxiliary insulating layer is higher than an etch rate of the second auxiliary insulating layer.

22. The method of claim 20, wherein the first connection electrode and the second connection electrode are spaced apart from the dummy connection electrode by the first auxiliary insulating layer.

23. The method of claim 20, further comprising the step of forming a first partition wall and a second partition wall, which are spaced apart from each other with the light-emitting element interposed therebetween.

* * * * *